US010410962B2

United States Patent
McMahon et al.

(10) Patent No.: US 10,410,962 B2
(45) Date of Patent: Sep. 10, 2019

(54) ENCAPSULATED CONFORMAL ELECTRONIC SYSTEMS AND DEVICES, AND METHODS OF MAKING AND USING THE SAME

(71) Applicant: MC10, Inc., Lexington, MA (US)

(72) Inventors: Nicholas McMahon, Bolton, MA (US); Xianyan Wang, San Jose, CA (US); Brian Elolampi, Belmont, MA (US); Bryan D. Keen, Somerville, MA (US); David G. Garlock, Derry, NH (US)

(73) Assignee: MC10, Inc., Lexington, MA (US)

( * ) Notice: Subject to any disclaimer, the term of this patent is extended or adjusted under 35 U.S.C. 154(b) by 0 days.

(21) Appl. No.: 15/108,861

(22) PCT Filed: Jan. 6, 2015

(86) PCT No.: PCT/US2015/010236
§ 371 (c)(1),
(2) Date: Jun. 29, 2016

(87) PCT Pub. No.: WO2015/103580
PCT Pub. Date: Jul. 9, 2015

(65) Prior Publication Data
US 2016/0322283 A1 Nov. 3, 2016

Related U.S. Application Data

(60) Provisional application No. 61/924,111, filed on Jan. 6, 2014, provisional application No. 61/947,709, filed on Mar. 4, 2014.

(51) Int. Cl.
*H01H 13/86* (2006.01)
*H01L 21/02* (2006.01)
(Continued)

(52) U.S. Cl.
CPC ...... *H01L 23/4985* (2013.01); *H01L 21/0206* (2013.01); *H01L 21/4864* (2013.01);
(Continued)

(58) Field of Classification Search
CPC ................ H01L 23/4985; H01L 21/4864
(Continued)

(56) References Cited

U.S. PATENT DOCUMENTS 3,716,861 A 2/1973 Root
3,805,427 A 4/1974 Epstein
(Continued)

FOREIGN PATENT DOCUMENTS

EP 0585670 A2 3/1994
EP 0779059 A1 6/1997
(Continued)

OTHER PUBLICATIONS

Carvalhal et al., "Electrochemical Detection in a Paper-Based Separation Device", Analytical Chemistry, vol. 82, No. 3, (1162-1165) (4 pages) (Jan. 7, 2010).
(Continued)

*Primary Examiner* — Farun Lu
(74) *Attorney, Agent, or Firm* — Nixon Peabody LLP

(57) ABSTRACT

Encapsulated conformal electronic devices, encapsulated conformal integrated circuit (IC) sensor systems, and methods of making and using encapsulated conformal electronic devices are presented herein. A conformal integrated circuit device is disclosed which includes a flexible substrate with electronic circuitry attached to the flexible substrate. A flexible encapsulation layer is attached to the flexible substrate. The flexible encapsulation layer encases the electronic circuitry between the flexible substrate and the encapsulation layer. For some configurations, the encapsulation layer and flexible substrate are fabricated from stretchable
(Continued)

and bendable non-conductive polymers. The electronic circuitry may comprise an integrated circuit sensor system with multiple device islands that are electrically and physically connected via a plurality of stretchable electrical interconnects.

30 Claims, 14 Drawing Sheets

(51) Int. Cl.
 H01L 21/48 (2006.01)
 H01L 21/56 (2006.01)
 H01L 21/66 (2006.01)
 H01L 23/00 (2006.01)
 H01L 23/29 (2006.01)
 H01L 23/31 (2006.01)
 H01L 23/498 (2006.01)
 H01L 23/538 (2006.01)

(52) U.S. Cl.
 CPC .......... *H01L 21/561* (2013.01); *H01L 21/565* (2013.01); *H01L 22/20* (2013.01); *H01L 23/293* (2013.01); *H01L 23/296* (2013.01); *H01L 23/3121* (2013.01); *H01L 23/3135* (2013.01); *H01L 23/49838* (2013.01); *H01L 23/49894* (2013.01); *H01L 23/562* (2013.01); *H01H 13/86* (2013.01); *H01L 23/5387* (2013.01); *H01L 2924/0002* (2013.01)

(58) Field of Classification Search
 USPC ........................................................ 257/419
 See application file for complete search history.

(56) References Cited

U.S. PATENT DOCUMENTS

| | | | |
|---|---|---|---|
| 3,838,240 A | 9/1974 | Schelhorn | |
| 4,278,474 A | 7/1981 | Blakeslee | |
| 4,304,235 A | 12/1981 | Kaufman | |
| 4,416,288 A | 11/1983 | Freeman | |
| 4,658,153 A | 4/1987 | Brosh | |
| 5,085,924 A * | 2/1992 | Eckberg | C08G 77/50 428/209 |
| 5,272,375 A | 12/1993 | Belopolsky | |
| 5,306,917 A | 4/1994 | Black | |
| 5,326,521 A | 7/1994 | East | |
| 5,331,966 A | 7/1994 | Bennett | |
| 5,360,987 A | 11/1994 | Shibib | |
| 5,471,982 A | 5/1995 | Edwards | |
| 5,454,270 A | 10/1995 | Brown | |
| 5,491,651 A | 2/1996 | Janic | |
| 5,567,975 A | 10/1996 | Walsh | |
| 5,580,794 A | 12/1996 | Allen | |
| 5,617,870 A | 4/1997 | Hastings | |
| 5,811,790 A | 9/1998 | Endo | |
| 5,817,008 A | 10/1998 | Rafert | |
| 5,907,477 A | 5/1999 | Tuttle | |
| 6,034,441 A * | 3/2000 | Chen | H01L 23/293 257/693 |
| 6,063,046 A | 5/2000 | Allum | |
| 6,265,090 B1 | 7/2001 | Nishide | |
| 6,282,960 B1 | 9/2001 | Samuels | |
| 6,343,514 B1 | 2/2002 | Smith | |
| 6,387,052 B1 | 5/2002 | Quinn | |
| 6,410,971 B1 | 6/2002 | Otey | |
| 6,421,016 B1 | 7/2002 | Phillips | |
| 6,455,931 B1 | 9/2002 | Hamilton | |
| 6,567,158 B1 | 5/2003 | Falcial | |
| 6,626,940 B2 | 9/2003 | Crowley | |
| 6,641,860 B1 | 11/2003 | Kaiserman | |
| 6,775,906 B1 | 8/2004 | Silverbrook | |
| 6,784,844 B1 | 8/2004 | Boakes | |
| 6,965,160 B2 | 11/2005 | Cobbley | |
| 6,987,314 B1 | 1/2006 | Yoshida | |
| 7,259,030 B2 | 8/2007 | Daniels | |
| 7,265,298 B2 | 9/2007 | Maghribi | |
| 7,302,751 B2 | 12/2007 | Hamburgen | |
| 7,337,012 B2 | 2/2008 | Maghribi | |
| 7,487,587 B2 | 2/2009 | Vanfleteren | |
| 7,491,892 B2 | 2/2009 | Wagner | |
| 7,521,292 B2 | 4/2009 | Rogers | |
| 7,557,367 B2 | 7/2009 | Rogers | |
| 7,618,260 B2 | 11/2009 | Daniel | |
| 7,622,367 B1 | 11/2009 | Nuzzo | |
| 7,727,228 B2 | 6/2010 | Abboud | |
| 7,739,791 B2 | 6/2010 | Brandenburg | |
| 7,759,167 B2 | 7/2010 | Vanfleteren | |
| 7,815,095 B2 | 10/2010 | Fujisawa | |
| 7,960,246 B2 | 6/2011 | Flamand | |
| 7,982,296 B2 | 7/2011 | Nuzzo | |
| 8,097,926 B2 * | 1/2012 | De Graff | H01L 27/14687 257/419 |
| 8,198,621 B2 | 6/2012 | Rogers | |
| 8,207,473 B2 | 6/2012 | Axisa | |
| 8,217,381 B2 | 7/2012 | Rogers | |
| 8,372,726 B2 | 2/2013 | De Graff | |
| 8,389,862 B2 | 3/2013 | Arora | |
| 8,431,828 B2 | 4/2013 | Vanfleteren | |
| 8,440,546 B2 | 5/2013 | Nuzzo | |
| 8,536,667 B2 | 9/2013 | De Graff | |
| 8,552,299 B2 | 10/2013 | Rogers | |
| 8,609,471 B2 | 12/2013 | Xu | |
| 8,618,656 B2 | 12/2013 | Oh | |
| 8,664,699 B2 | 3/2014 | Nuzzo | |
| 8,679,888 B2 | 3/2014 | Rogers | |
| 8,729,524 B2 | 5/2014 | Rogers | |
| 8,754,396 B2 | 6/2014 | Rogers | |
| 8,865,489 B2 | 10/2014 | Rogers | |
| 8,886,334 B2 | 11/2014 | Ghaffari | |
| 8,905,772 B2 | 12/2014 | Rogers | |
| 9,012,784 B2 | 4/2015 | Arora | |
| 9,082,025 B2 | 7/2015 | Fastert | |
| 9,105,555 B2 | 8/2015 | Rogers | |
| 9,105,782 B2 | 8/2015 | Rogers | |
| 9,119,533 B2 | 9/2015 | Ghaffari | |
| 9,123,614 B2 | 9/2015 | Graff | |
| 9,159,635 B2 | 10/2015 | Elolampi | |
| 9,168,094 B2 | 10/2015 | Lee | |
| 9,171,794 B2 | 10/2015 | Rafferty | |
| 9,186,060 B2 | 11/2015 | De Graff | |
| 9,226,402 B2 | 12/2015 | Hsu | |
| 9,247,637 B2 | 1/2016 | Hsu | |
| 9,289,132 B2 | 3/2016 | Ghaffari | |
| 9,295,842 B2 | 3/2016 | Ghaffari | |
| 9,324,733 B2 | 4/2016 | Rogers | |
| 9,372,123 B2 | 6/2016 | Li | |
| 9,408,305 B2 | 8/2016 | Hsu | |
| 2001/0012918 A1 | 8/2001 | Swanson | |
| 2001/0021867 A1 | 9/2001 | Kordis | |
| 2002/0026127 A1 | 2/2002 | Balbierz | |
| 2002/0082515 A1 | 6/2002 | Campbell | |
| 2002/0094701 A1 | 7/2002 | Biegelsen | |
| 2002/0113739 A1 | 8/2002 | Howard | |
| 2002/0128700 A1 | 9/2002 | Cross, Jr. | |
| 2002/0145467 A1 | 10/2002 | Minch | |
| 2002/0151934 A1 | 10/2002 | Levine | |
| 2002/0158330 A1 | 10/2002 | Moon | |
| 2003/0017848 A1 | 1/2003 | Engstrom | |
| 2003/0045025 A1 | 3/2003 | Coyle | |
| 2003/0097165 A1 | 5/2003 | Krulevitch | |
| 2003/0120271 A1 | 6/2003 | Burnside | |
| 2003/0162507 A1 | 8/2003 | Vatt | |
| 2003/0214408 A1 | 11/2003 | Grajales | |
| 2003/0236455 A1 | 12/2003 | Swanson | |
| 2004/0006264 A1 | 1/2004 | Mojarradi | |
| 2004/0085469 A1 | 5/2004 | Johnson | |
| 2004/0092806 A1 | 5/2004 | Sagon | |
| 2004/0106334 A1 | 6/2004 | Suzuki | |
| 2004/0135094 A1 | 7/2004 | Niigaki | |
| 2004/0138558 A1 | 7/2004 | Dunki-Jacobs | |
| 2004/0149921 A1 | 8/2004 | Smyk | |

(56) References Cited

U.S. PATENT DOCUMENTS

| | | |
|---|---|---|
| 2004/0178466 A1 | 9/2004 | Merrill |
| 2004/0192082 A1 | 9/2004 | Wagner |
| 2004/0201134 A1 | 10/2004 | Kawai |
| 2004/0203486 A1 | 10/2004 | Shepherd |
| 2004/0221370 A1 | 11/2004 | Hannula |
| 2004/0243204 A1 | 12/2004 | Maghribi |
| 2005/0021103 A1 | 1/2005 | DiLorenzo |
| 2005/0029680 A1 | 2/2005 | Jung |
| 2005/0067293 A1 | 3/2005 | Naito |
| 2005/0070778 A1 | 3/2005 | Lackey |
| 2005/0096513 A1 | 5/2005 | Ozguz |
| 2005/0113744 A1 | 5/2005 | Donoghue |
| 2005/0139683 A1 | 6/2005 | Yi |
| 2005/0171524 A1 | 8/2005 | Stern |
| 2005/0203366 A1 | 9/2005 | Donoghue |
| 2005/0248312 A1 | 11/2005 | Cao |
| 2005/0285262 A1 | 12/2005 | Knapp |
| 2006/0003709 A1 | 1/2006 | Wood |
| 2006/0038182 A1 | 2/2006 | Rogers |
| 2006/0071349 A1 | 4/2006 | Tokushige |
| 2006/0084394 A1 | 4/2006 | Engstrom |
| 2006/0106321 A1 | 5/2006 | Lewinsky |
| 2006/0128346 A1 | 6/2006 | Yasui |
| 2006/0154398 A1 | 7/2006 | Qing |
| 2006/0160560 A1 | 7/2006 | Josenhans |
| 2006/0248946 A1 | 11/2006 | Howell |
| 2006/0257945 A1 | 11/2006 | Masters |
| 2006/0264767 A1 | 11/2006 | Shennib |
| 2006/0270135 A1 | 11/2006 | Chrysler |
| 2006/0286785 A1 | 12/2006 | Rogers |
| 2007/0027514 A1 | 2/2007 | Gerber |
| 2007/0031283 A1 | 2/2007 | Davis |
| 2007/0108389 A1 | 5/2007 | Makela |
| 2007/0113399 A1 | 5/2007 | Kumar |
| 2007/0123756 A1 | 5/2007 | Kitajima |
| 2007/0270672 A1 | 11/2007 | Hayter |
| 2008/0036097 A1 | 2/2008 | Ito |
| 2008/0046080 A1 | 2/2008 | Vanden Bulcke |
| 2008/0074383 A1 | 3/2008 | Dean |
| 2008/0096620 A1 | 4/2008 | Lee |
| 2008/0139894 A1 | 6/2008 | Szydlo-Moore |
| 2008/0157235 A1 | 7/2008 | Rogers |
| 2008/0188912 A1 | 8/2008 | Stone |
| 2008/0193749 A1 | 8/2008 | Thompson |
| 2008/0204021 A1 | 8/2008 | Leussler |
| 2008/0211087 A1 | 9/2008 | Mueller-Hipper |
| 2008/0237840 A1 | 10/2008 | Alcoe |
| 2008/0259576 A1 | 10/2008 | Johnson |
| 2008/0262381 A1 | 10/2008 | Kolen |
| 2008/0287167 A1 | 11/2008 | Caine |
| 2008/0313552 A1 | 12/2008 | Buehler |
| 2009/0000377 A1 | 1/2009 | Shipps |
| 2009/0001550 A1 | 1/2009 | Yonggang |
| 2009/0015560 A1 | 1/2009 | Robinson |
| 2009/0017884 A1 | 1/2009 | Rotschild |
| 2009/0048556 A1 | 2/2009 | Durand |
| 2009/0088750 A1 | 4/2009 | Hushka |
| 2009/0107704 A1 | 4/2009 | Vanfleteren |
| 2009/0154736 A1 | 6/2009 | Lee |
| 2009/0184254 A1 | 7/2009 | Miura |
| 2009/0204168 A1 | 8/2009 | Kallmeyer |
| 2009/0215385 A1 | 8/2009 | Waters |
| 2009/0225751 A1 | 9/2009 | Koenck |
| 2009/0261828 A1 | 10/2009 | Nordmeyer-Massner |
| 2009/0273909 A1 | 11/2009 | Shin |
| 2009/0283891 A1 | 11/2009 | Dekker |
| 2009/0291508 A1 | 11/2009 | Babu |
| 2009/0294803 A1 | 12/2009 | Nuzzo |
| 2009/0322480 A1 | 12/2009 | Benedict |
| 2010/0002402 A1 | 1/2010 | Rogers |
| 2010/0059863 A1 | 3/2010 | Rogers |
| 2010/0072577 A1 | 3/2010 | Nuzzo |
| 2010/0073669 A1 | 3/2010 | Colvin |
| 2010/0087782 A1 | 4/2010 | Ghaffari |
| 2010/0090781 A1 | 4/2010 | Yamamoto |
| 2010/0090824 A1 | 4/2010 | Rowell |
| 2010/0116526 A1 | 5/2010 | Arora |
| 2010/0117660 A1 | 5/2010 | Douglas |
| 2010/0178722 A1 | 7/2010 | De Graff |
| 2010/0245011 A1 | 9/2010 | Chatzopoulos |
| 2010/0271191 A1 | 10/2010 | De Graff |
| 2010/0298895 A1 | 11/2010 | Ghaffari |
| 2010/0317132 A1 | 12/2010 | Rogers |
| 2010/0321161 A1 | 12/2010 | Isabell |
| 2010/0327387 A1 | 12/2010 | Kasai |
| 2011/0011179 A1 | 1/2011 | Gustafsson |
| 2011/0019370 A1 | 1/2011 | Koh |
| 2011/0034912 A1 | 2/2011 | De Graff |
| 2011/0049730 A1* | 3/2011 | Schmid ............... C23C 16/0272 257/787 |
| 2011/0051384 A1 | 3/2011 | Kriechbaum |
| 2011/0054583 A1 | 3/2011 | Litt |
| 2011/0098583 A1 | 4/2011 | Pandia |
| 2011/0101789 A1 | 5/2011 | Salter |
| 2011/0121822 A1 | 5/2011 | Parsche |
| 2011/0140897 A1 | 6/2011 | Purks |
| 2011/0175735 A1 | 7/2011 | Forster |
| 2011/0184320 A1 | 7/2011 | Shipps |
| 2011/0215931 A1 | 9/2011 | Callsen |
| 2011/0218756 A1 | 9/2011 | Callsen |
| 2011/0218757 A1 | 9/2011 | Callsen |
| 2011/0220890 A1 | 9/2011 | Nuzzo |
| 2011/0263950 A1 | 10/2011 | Larson |
| 2011/0277813 A1 | 11/2011 | Rogers |
| 2011/0284268 A1 | 11/2011 | Palaniswamy |
| 2011/0306851 A1 | 12/2011 | Wang |
| 2012/0016258 A1 | 1/2012 | Webster |
| 2012/0051005 A1 | 3/2012 | Vanfleteren |
| 2012/0052268 A1 | 3/2012 | Axisa |
| 2012/0065937 A1 | 3/2012 | De Graff |
| 2012/0074546 A1 | 3/2012 | Chong |
| 2012/0087216 A1 | 4/2012 | Keung |
| 2012/0091594 A1 | 4/2012 | Landesberger |
| 2012/0092178 A1 | 4/2012 | Callsen |
| 2012/0092222 A1 | 4/2012 | Kato |
| 2012/0101413 A1 | 4/2012 | Beetel |
| 2012/0101538 A1 | 4/2012 | Ballakur |
| 2012/0108012 A1 | 5/2012 | Yasuda |
| 2012/0126418 A1 | 5/2012 | Feng |
| 2012/0157804 A1 | 6/2012 | Rogers |
| 2012/0172697 A1 | 7/2012 | Urman |
| 2012/0178367 A1 | 7/2012 | Matsumoto |
| 2012/0226130 A1 | 9/2012 | De Graff |
| 2012/0244848 A1 | 9/2012 | Ghaffari |
| 2012/0256308 A1 | 10/2012 | Helin |
| 2012/0316455 A1 | 12/2012 | Rahman |
| 2012/0327608 A1 | 12/2012 | Rogers |
| 2013/0041235 A1 | 2/2013 | Rogers |
| 2013/0099358 A1 | 4/2013 | Elolampi |
| 2013/0100618 A1 | 4/2013 | Rogers |
| 2013/0116520 A1 | 5/2013 | Roham |
| 2013/0118255 A1 | 5/2013 | Callsen |
| 2013/0150693 A1 | 6/2013 | D'angelo |
| 2013/0185003 A1 | 7/2013 | Carbeck |
| 2013/0192356 A1 | 8/2013 | De Graff |
| 2013/0200268 A1 | 8/2013 | Rafferty |
| 2013/0211761 A1 | 8/2013 | Brandsma |
| 2013/0214300 A1 | 8/2013 | Lerman |
| 2013/0215467 A1 | 8/2013 | Fein |
| 2013/0225965 A1 | 8/2013 | Ghaffari |
| 2013/0237150 A1 | 9/2013 | Royston |
| 2013/0245388 A1 | 9/2013 | Rafferty |
| 2013/0274562 A1 | 10/2013 | Ghaffari |
| 2013/0313713 A1 | 11/2013 | Arora |
| 2013/0316442 A1 | 11/2013 | Meurville |
| 2013/0316487 A1 | 11/2013 | De Graff |
| 2013/0316645 A1 | 11/2013 | Li |
| 2013/0320503 A1 | 12/2013 | Nuzzo |
| 2013/0321373 A1 | 12/2013 | Yoshizumi |
| 2013/0328219 A1 | 12/2013 | Chau |
| 2014/0001058 A1 | 1/2014 | Ghaffari |
| 2014/0012160 A1 | 1/2014 | Ghaffari |
| 2014/0012242 A1 | 1/2014 | Lee |
| 2014/0022746 A1 | 1/2014 | Hsu |

(56) References Cited

U.S. PATENT DOCUMENTS

| | | |
|---|---|---|
| 2014/0039290 A1 | 2/2014 | De Graff |
| 2014/0042005 A1* | 2/2014 | Lee ............... H01H 13/83 200/5 A |
| 2014/0097944 A1 | 4/2014 | Fastert |
| 2014/0110859 A1 | 4/2014 | Rafferty |
| 2014/0140020 A1 | 5/2014 | Rogers |
| 2014/0188426 A1 | 7/2014 | Fastert |
| 2014/0191236 A1 | 7/2014 | Nuzzo |
| 2014/0216524 A1 | 8/2014 | Rogers |
| 2014/0240932 A1 | 8/2014 | Hsu |
| 2014/0249520 A1 | 9/2014 | Ghaffari |
| 2014/0303452 A1 | 10/2014 | Ghaffari |
| 2014/0303680 A1 | 10/2014 | Donnelly |
| 2014/0340857 A1 | 11/2014 | Hsu |
| 2014/0374872 A1 | 12/2014 | Rogers |
| 2014/0375465 A1 | 12/2014 | Fenuccio |
| 2015/0001462 A1 | 1/2015 | Rogers |
| 2015/0019135 A1 | 1/2015 | Kacyvenski |
| 2015/0025394 A1 | 1/2015 | Hong |
| 2015/0035680 A1 | 2/2015 | Li |
| 2015/0069617 A1 | 3/2015 | Arora |
| 2015/0099976 A1 | 4/2015 | Ghaffari |
| 2015/0100135 A1 | 4/2015 | Ives |
| 2015/0194817 A1 | 7/2015 | Lee |
| 2015/0237711 A1 | 8/2015 | Rogers |
| 2015/0241288 A1 | 8/2015 | Keen |
| 2015/0260713 A1 | 9/2015 | Ghaffari |
| 2015/0272652 A1 | 10/2015 | Ghaffari |
| 2015/0286913 A1 | 10/2015 | Fastert |
| 2015/0320472 A1 | 11/2015 | Ghaffari |
| 2015/0335254 A1 | 11/2015 | Elolampi |
| 2015/0342036 A1 | 11/2015 | Fastert |
| 2016/0027834 A1 | 1/2016 | de Graff |
| 2016/0045162 A1 | 2/2016 | De Graff |
| 2016/0081192 A1 | 3/2016 | Hsu |
| 2016/0086909 A1 | 3/2016 | Garlock |
| 2016/0095652 A1 | 4/2016 | Lee |
| 2016/0099214 A1 | 4/2016 | Dalal |
| 2016/0099227 A1 | 4/2016 | Dalal |
| 2016/0111353 A1 | 4/2016 | Rafferty |
| 2016/0135740 A1 | 5/2016 | Ghaffari |
| 2016/0213262 A1 | 7/2016 | Ghaffari |
| 2016/0213424 A1 | 7/2016 | Ghaffari |
| 2016/0228640 A1 | 8/2016 | Pindado |
| 2016/0232807 A1 | 8/2016 | Ghaffari |
| 2016/0240061 A1 | 8/2016 | Li |
| 2016/0249174 A1 | 8/2016 | Patel |
| 2016/0256070 A1 | 9/2016 | Murphy |

FOREIGN PATENT DOCUMENTS

| | | |
|---|---|---|
| EP | 1808124 A2 | 7/2007 |
| EP | 2259062 A2 | 12/2010 |
| JP | 05-087511 A | 4/1993 |
| JP | 9-201338 A | 8/1997 |
| JP | 2005-052212 A | 3/2005 |
| JP | 2007-042829 A | 2/2007 |
| JP | 2009-170173 A | 7/2009 |
| JP | 2011-082050 A | 4/2011 |
| JP | 2012-134272 A | 7/2012 |
| JP | 2012-515436 A | 7/2012 |
| WO | WO 1999/038211 A2 | 7/1999 |
| WO | WO 2005/122285 A2 | 12/2005 |
| WO | WO 2003/021679 A2 | 3/2006 |
| WO | WO 2007/003019 A2 | 1/2007 |
| WO | WO 2007/024983 A2 | 3/2007 |
| WO | WO 2007/116344 A1 | 10/2007 |
| WO | WO 2007/136726 A2 | 11/2007 |
| WO | WO 2008/030960 A2 | 3/2008 |
| WO | WO 2009/111641 A1 | 9/2009 |
| WO | WO 2009/114689 A1 | 9/2009 |
| WO | WO 2010/036807 A1 | 4/2010 |
| WO | WO 2010/042653 A1 | 4/2010 |
| WO | WO 2010/042957 A2 | 4/2010 |
| WO | WO 2010/046883 A1 | 4/2010 |
| WO | WO 2010/056857 A2 | 5/2010 |
| WO | WO 2010/081137 A2 | 7/2010 |
| WO | WO 2010/082993 A2 | 7/2010 |
| WO | WO 2010/102310 A2 | 9/2010 |
| WO | WO 2010/132552 A1 | 11/2010 |
| WO | WO 2011/003181 A1 | 1/2011 |
| WO | WO 2011/041727 A1 | 4/2011 |
| WO | WO 2011/084450 A1 | 7/2011 |
| WO | WO 2011/084709 A2 | 7/2011 |
| WO | WO 2011/127331 A2 | 10/2011 |
| WO | WO 2012/125494 A2 | 9/2012 |
| WO | WO 2012/166686 A2 | 12/2012 |
| WO | WO 2013/010171 A1 | 1/2013 |
| WO | WO 2013/022853 A1 | 2/2013 |
| WO | WO 2013/033724 A1 | 3/2013 |
| WO | WO 2013/034987 A3 | 3/2013 |
| WO | WO 2013/049716 A1 | 4/2013 |
| WO | WO 2013/052919 A2 | 4/2013 |
| WO | WO 2013/170032 A2 | 11/2013 |
| WO | WO 2014/007871 A1 | 1/2014 |
| WO | WO 2014/058473 A1 | 4/2014 |
| WO | WO 2014/059032 A1 | 4/2014 |
| WO | WO 2014/106041 A1 | 7/2014 |
| WO | WO 2014/110176 A1 | 7/2014 |
| WO | WO 2014/130928 A2 | 8/2014 |
| WO | WO 2014/130931 A1 | 8/2014 |
| WO | WO 2014/186467 A2 | 11/2014 |
| WO | WO 2014/197443 A1 | 12/2014 |
| WO | WO 2014/205434 A2 | 12/2014 |
| WO | WO 2015/021039 A1 | 2/2015 |
| WO | WO 2015/054312 A1 | 4/2015 |
| WO | WO 2015/077559 A1 | 5/2015 |
| WO | WO 2015/080991 A1 | 6/2015 |
| WO | WO 2015/102951 A2 | 7/2015 |
| WO | WO 2015/103483 A1 | 7/2015 |
| WO | WO 2015/103580 A2 | 7/2015 |
| WO | WO 2015/127458 A1 | 8/2015 |
| WO | WO 2015/134588 A1 | 9/2015 |
| WO | WO 2015/138712 A1 | 9/2015 |
| WO | WO 2016/048888 A1 | 3/2016 |
| WO | WO 2016/054512 A1 | 4/2016 |
| WO | WO 2016/057318 A1 | 4/2016 |
| WO | WO 2016/081244 A1 | 5/2016 |
| WO | WO 2016/127050 A1 | 8/2016 |
| WO | WO 2016/134306 A1 | 8/2016 |

OTHER PUBLICATIONS

Demura et al., "Immobilization of Glucose Oxidase with *Bombyx mori* Silk Fibroin by Only Stretching Treatment and its Application to Glucose Sensor," Biotechnology and Bioengineering, vol. 33, 598-603 (6 pages) (1989).

Ellerbee et al., "Quantifying Colorimetric Assays in Paper-Based Microfluidic Devices by Measuring the Transmission of Light through Paper," Analytical Chemistry, vol. 81, No. 20 8447-8452, (6 pages) (Oct. 15, 2009).

Halsted, "Ligature and Suture Material," Journal of the American Medical Association, vol. LX, No. 15, 1119-1126, (8 pages) (Apr. 12, 1913).

Kim et al., "Complementary Metal Oxide Silicon Integrated Circuits Incorporating Monolithically Integrated Stretchable Wavy Interconnects," Applied Physics Letters, vol. 93, 044102-044102.3 (3 pages) (Jul. 31, 2008).

Kim et al., "Dissolvable Films of Silk Fibroin for Ultrathin Conformal Bio-Integrated Electronics," Nature, 1-8 (8 pages) (Apr. 18, 2010).

Kim et al., "Materials and Noncoplanar Mesh Designs for Integrated Circuits with Linear Elastic Responses to Extreme Mechanical Deformations," PNAS, vol. 105, No. 48, 18675-18680 (6 pages) (Dec. 2, 2008).

Kim et al., "Stretchable and Foldable Silicon Integrated Circuits," Science, vol. 320, 507-511 (5 pages) (Apr. 25, 2008).

Kim et al., "Electrowetting on Paper for Electronic Paper Display," ACS Applied Materials & Interfaces, vol. 2, No. 11, (3318-3323) (6 pages) (Nov. 24, 2010).

(56) References Cited

OTHER PUBLICATIONS

Ko et al., "A Hemispherical Electronic Eye Camera Based on Compressible Silicon Optoelectronics," Nature, vol. 454, 748-753 (6 pages) (Aug. 7, 2008).
Lawrence et al., "Bioactive Silk Protein Biomaterial Systems for Optical Devices," Biomacromolecules, vol. 9, 1214-1220 (7 pages) (Nov. 4, 2008).
Meitl et al., "Transfer Printing by Kinetic Control of Adhesion to an Elastomeric Stamp," Nature, vol. 5, 33-38 (6 pages) (Jan. 2006).
Omenetto et al., "A New Route for Silk," Nature Photonics, vol. 2, 641-643 (3 pages) (Nov. 2008).
Omenetto et al., "New Opportunities for an Ancient Material," Science, vol. 329, 528-531 (5 pages) (Jul. 30, 2010).
Siegel et al., "Foldable Printed Circuit Boards on Paper Substrates," Advanced Functional Materials, vol. 20, No. 1, 28-35, (8 pages) (Jan. 8, 2010).
Tsukada et al., "Structural Changes of Silk Fibroin Membranes Induced by Immersion in Methanol Aqueous Solutions," Journal of Polymer Science, vol. 32, 961-968 (8 pages) (1994).
Wang et al., "Controlled Release From Multilayer Silk Biomaterial Coatings to Modulate Vascular Cell Responses" Biomaterials, 29, 894-903 (10 pages) (Nov. 28, 2008).
Wikipedia, "Ball bonding" article [online]. Cited in PCT/US2015/051210 search report dated Mar. 1, 2016 with the following information "Jun. 15, 2011 [retrieved on Nov. 15, 2015}. Retrieved Dec. 29, 2018 from the Internet: <URL: https://web.archive.org/web/20110615221003/hltp://en.wikipedia.org/wiki/Ball_bonding>., entire document, especially para 1, 4, 5, 6," 2 pages, last page says ("last modified on May 11, 2011").
International Search Report, PCT/US2015/010236, dated Jun. 4, 2015 (4 pages).
Written Opinion of the International Searching Authority, PCT/US2015/010236, dated Jun. 4, 2015 (6 pages).
Kinkeldei et al., "Encapsulation for Flexible Electronic Devices," IEEE Electron Device Letters, vol. 32, No. 12, 1743-1745 (3 pages) (Dec. 1, 2011).
Supplementary European Search Report, EP15733182.8, dated Aug. 28, 2017 (7 pages).

\* cited by examiner

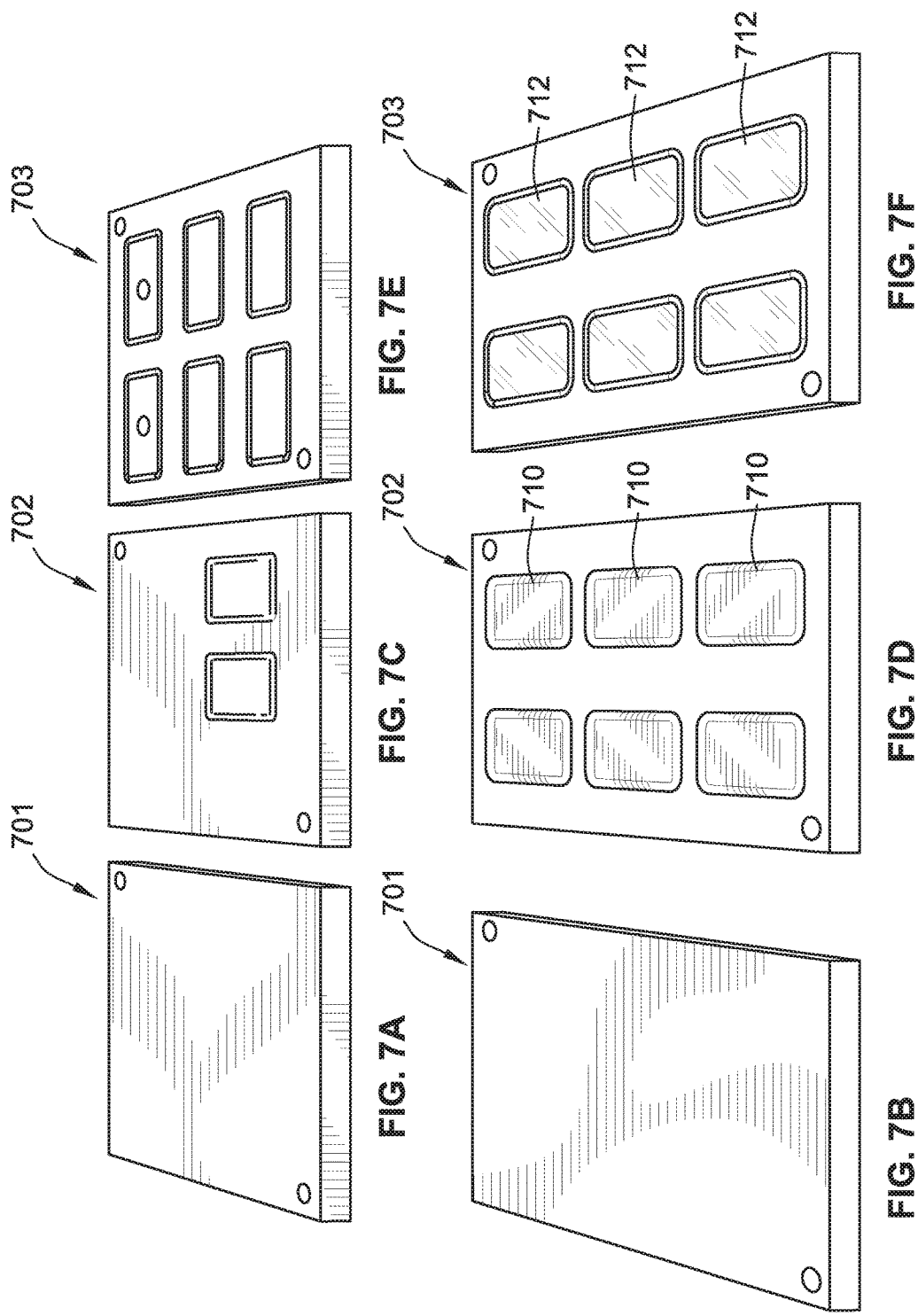

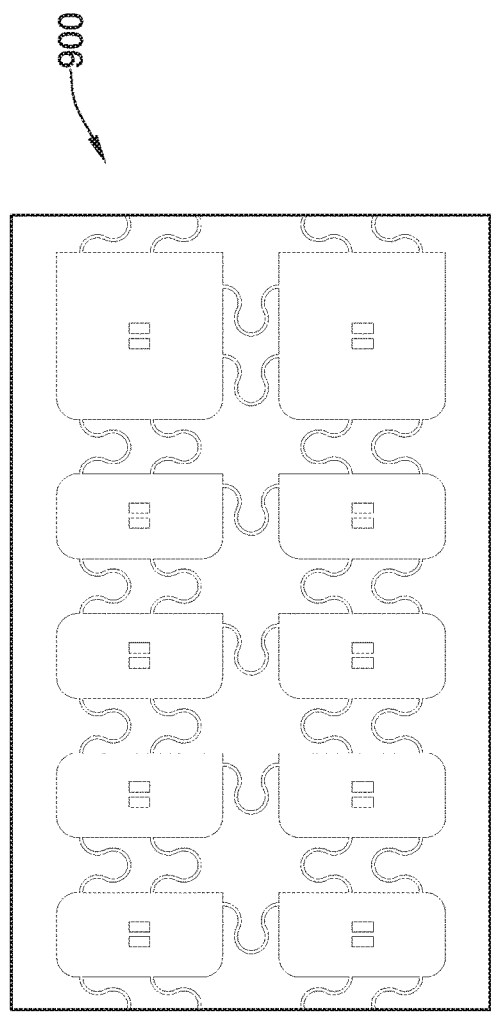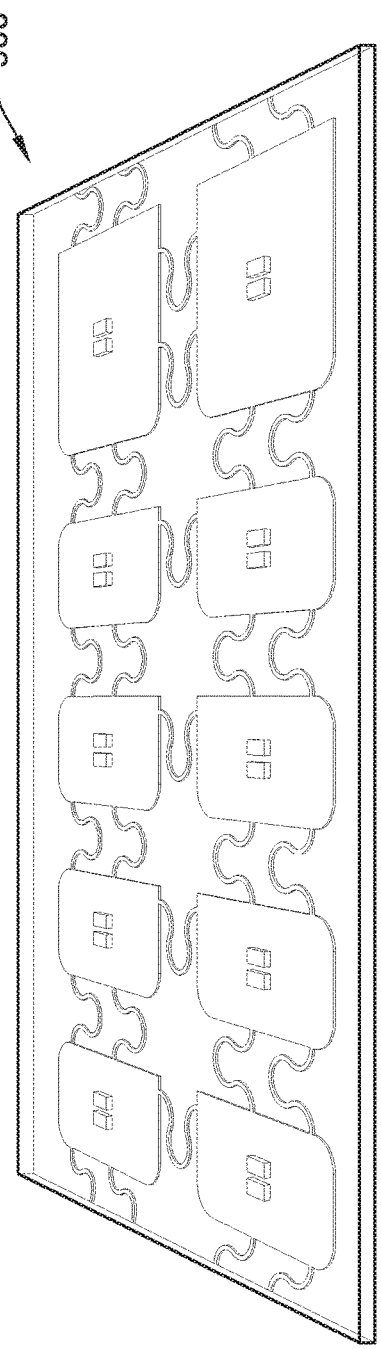

ENCAPSULATED CONFORMAL ELECTRONIC SYSTEMS AND DEVICES, AND METHODS OF MAKING AND USING THE SAME

CROSS-REFERENCE TO RELATED PATENT APPLICATIONS

This application is a U.S. National Stage of International Application No. PCT/US2015/010236, filed Jan. 6, 2015, which claims the benefit of priority to U.S. Provisional Patent Application No. 61/924,111, which was filed on Jan. 6, 2014, and U.S. Provisional Patent Application No. 61/947,709, which was filed on Mar. 4, 2014, all of which are incorporated herein by reference in their respective entireties and for all purposes.

TECHNICAL FIELD

Aspects of the present disclosure relate generally to flexible and stretchable integrated circuit (IC) electronics. More particularly, aspects of this disclosure relate to conformal electronic systems with encapsulated IC device islands.

BACKGROUND

Integrated circuits (IC) are the cornerstone of the information age and the foundation of today's information technology industries. The integrated circuit, a.k.a. "microchip," is a set of interconnected electronic components, such as transistors, capacitors, and resistors, which are etched or imprinted onto a tiny wafer of semiconducting material, such as silicon or germanium. Integrated circuits take on various forms including, as some non-limiting examples, microprocessors, amplifiers, Flash memories, application specific integrated circuits (ASICs), static random access memories (SRAMs), digital signal processors (DSPs), dynamic random access memories (DRAMs), erasable programmable read only memories (EPROMs), and programmable logic. Integrated circuits are used in innumerable products, including personal computers, laptop and tablet computers, smartphones, flat-screen televisions, medical instruments, telecommunication and networking equipment, airplanes, watercraft and automobiles.

Advances in integrated circuit technology and microchip manufacturing have led to a steady decrease in chip size and an increase in circuit density and circuit performance. The scale of semiconductor integration has advanced to the point where a single semiconductor chip can hold tens of millions to over a billion devices in a space smaller than a U.S. penny. Moreover, the width of each conducting line in a modern microchip can be made as small as a fraction of a nanometer. The operating speed and overall performance of a semiconductor chip (e.g., clock speed and signal net switching speeds) has concomitantly increased with the level of integration. To keep pace with increases in on-chip circuit switching frequency and circuit density, semiconductor packages currently offer higher pin counts, greater power dissipation, more protection, and higher speeds than packages of just a few years ago.

Conventional microchips are generally rigid structures that are not designed to be bent or stretched during normal operating conditions. Likewise, most microchips and other IC modules are typically mounted on a printed circuit board (PCB) that is similarly rigid. Processes using rigid IC's and rigid PCB's are generally incompatible for applications requiring stretchable or bendable electronics. Consequently, many schemes have been proposed for embedding microchips on or in a flexible polymeric substrate. This, in turn, enables many useful device configurations not otherwise possible with rigid silicon-based electronic devices. However, many of these schemes use embedded chips that are thicker than the individual layers of flexible polymer that make up the flexible printed circuit board assembly (FPCBA). Such schemes are not compatible for "thin chip" configurations. In addition, available processes for making flexible circuits oftentimes require multiple layers of expensive materials, which not only increases material and manufacturing costs but also results in a composite structure that is undesirably thick.

SUMMARY

Disclosed herein are encapsulated conformal electronic integrated circuit (IC) devices and conformal electronic systems with encapsulated IC device islands, including methods of making and methods of using the same. By way of example, there are described systems and methods for encapsulating conformal electronic devices, such as conformal electronic sensor assemblies. Said sensor assemblies may be used, for example, for sensing, measuring, or otherwise quantifying motion, including motion and/or muscle activity of at least one body part of a mammalian subject. In some examples, such conformal electronic sensor assemblies can be configured to attach directly to, lay against, and monitor motion of a human body part. Disclosed encapsulation methods can, for example, increase the durability, comfort, and/or aesthetic appeal of the conformal electronic devices described herein, as well as provide, for example, versatility, cost savings, and scale-up capability.

Also disclosed are processes for encapsulating at least a portion of conformal electronics into flexible and/or stretchable materials, such as soft elastomeric materials. Methods are disclosed for encapsulating relatively fragile conformal electronics, such as a flexible printed circuit board assembly (FPCBA), to generate more robust devices that are protected from mechanical and/or environmental damage. Inventive aspects of this disclosure are also directed to conformal electronic devices that include an encapsulation housing that envelops the entire conformal electronics device. Encapsulation housings can be stamped, molded or otherwise fabricated separately from the remainder of the conformal electronics device. The encapsulation housing can be molded or otherwise generated as a single-piece unitary structure that is disposed over portions of the conformal electronic device and laminated or otherwise attached thereto. Alternatively, encapsulation housings can be molded or otherwise generated in two or more separate housing components which can be coupled, assembled, or otherwise combined with an example conformal electronics device to provide an encapsulated conformal electronics device.

Aspects of the present disclosure are directed to conformal integrated circuit (IC) devices. In an embodiment, a conformal IC device includes a flexible substrate with electronic circuitry attached to the flexible substrate. A flexible encapsulation layer is attached to the flexible substrate. The flexible encapsulation layer encases the electronic circuitry between the flexible substrate and the encapsulation layer. For some configurations, the encapsulation layer and flexible substrate are fabricated from stretchable and bendable non-conductive polymers. The polymer may include a polyimide (PI), a polyethylene terephthalate (PET), a silicone, or a polyurethane, or any combination thereof. The electronic circuitry may comprise an integrated circuit sensor system with at least one sensing device and at least one controller device. The electronic circuitry may comprise multiple spaced device islands that are electrically and physically connected via a plurality of stretchable electrical interconnects.

According to other aspects of the present disclosure, conformal electronics devices are disclosed. In an embodiment, a conformal electronics device includes an elongated flexible polymeric substrate, and a plurality of surface-mount technology (SMT) components configured as device islands attached to the flexible polymeric substrate. A plurality of stretchable interconnects electrically connect the SMT components. The conformal electronics device also includes a flexible polymeric encapsulation layer that is attached to the flexible polymeric substrate. The flexible polymeric encapsulation layer encases the SMT components and the stretchable interconnects between the flexible substrate and the encapsulation layer.

Other aspects of the present disclosure are directed to methods for making and methods for using flexible integrated circuits. In one aspect, a method for encapsulating a conformal electronic device is disclosed. The method includes: receiving or providing a first silicone sheet; receiving or providing a second silicone sheet; placing the first silicone sheet into an assembly fixture; dispensing a first shot of adhesive onto the first silicone sheet; placing flexible printed circuit board assemblies (FPCBA) on top of the first shot of adhesive in the assembly fixture; dispensing a second shot of adhesive onto the flexible printed circuit board assemblies; placing the second silicone sheet on top of the second shot of adhesive in the assembly fixture to create a stack; and, transporting the assembly fixture with the first and second silicone sheets and the flexible printed circuit board assemblies through a roll laminator.

The method may further comprise, singly or in any combination: cleaning bonding surfaces of the silicone sheets prior to the placing the second silicone sheet on top of the second shot of adhesive; inspecting the silicone sheets prior to the cleaning the bonding surfaces; cleaning both sides of the flexible printed circuit board assemblies prior to placing the FPCBA's on top of the first shot of adhesive; inspecting the FPCBA's prior to the cleaning the sides of the FPCBA's; placing a protective laminant sheet over the assembly fixture prior to the transporting the assembly fixture through the roll laminator; removing the assembly fixture from the roll laminator and allowing the shots of adhesive to cure; and/or die cutting a plurality of encapsulated conformal electronic devices from the cured stack.

The above summary is not intended to represent every embodiment or every aspect of the present disclosure. Rather, the foregoing summary merely provides an exemplification of some of the novel aspects and features set forth herein. The above features and advantages, and other features and advantages of the present disclosure, will be readily apparent from the following detailed description of representative embodiments and modes for carrying out the present invention when taken in connection with the accompanying drawings and the appended claims.

BRIEF DESCRIPTION OF THE DRAWINGS

FIGS. 7A-7F present representative plate-molding tools for encapsulating electronic sensor devices using an overmolding process in accord with aspects of the present disclosure.

FIGS. 9A and 9B are plan-view and bottom perspective-view illustrations, respectively, of an encapsulated conformal electronics device in accord with aspects of the present disclosure.

DETAILED DESCRIPTION OF THE ILLUSTRATED EMBODIMENTS

Figure 1:
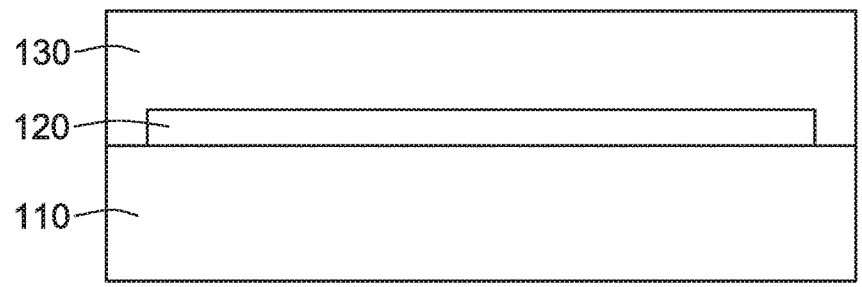
FIG. 1 is a side-view illustration of an example of a conformal electronics device with an encapsulation layer in accord with aspects of the present disclosure.

This disclosure is susceptible of embodiment in many different forms. There are shown in the drawings, and will herein be described in detail, representative embodiments with the understanding that the present disclosure is to be considered as an exemplification of the principles of the present disclosure and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference or otherwise. For purposes of the present detailed description, unless specifically disclaimed or logically prohibited: the singular includes the plural and vice versa; and the words "including" or "comprising" or "having" means "including without limitation." Moreover, words of approximation, such as "about," "almost," "substantially," "approximately," and the like, can be used herein in the sense of "at, near, or nearly at," or "within 3-5% of," or "within acceptable manufacturing tolerances," or any logical combination thereof, for example.

It should be understood that any and all combinations of the features, functions and concepts discussed in detail herein are contemplated as being part of the inventive subject matter (provided such concepts are not mutually inconsistent). For example, although differing in appearance, the individual systems and devices and functional componentry depicted and discussed herein can each take on any of the various forms, optional configurations, and functional alternatives described above and below with respect to the other disclosed embodiments, unless explicitly disclaimed or otherwise logically prohibited. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

With respect to components, substrates, layers or other surfaces described in the Detailed Description in connection with various examples of the principles herein, any spatial references to "top" and "bottom" are used primarily to indicate relative position, alignment, and/or orientation of various elements/components with respect to the component or substrate and each other. These terms do not necessarily restrict to a particular frame of reference (e.g., a gravitational frame of reference) unless explicitly stated. Thus, reference to a "bottom" of a component, substrate, or a layer does not necessarily require that the indicated component, substrate, or layer be facing a ground surface. Similarly, other terms of spatial reference, such as "over," "under," "above," "beneath," and the like, do not necessarily restrict to a particular frame of reference, such as a gravitational frame of reference, but rather are used primarily to indicate relative position, alignment and/or orientation of various elements/components with respect to the substrate (or other surface) and each other. Moreover, use of the terms "disposed on" and "disposed over" in the Detailed Description encompass the meaning of "embedded in" and "partially embedded in," and vice versa. In addition, reference to feature A being "disposed on," "disposed between," or "disposed over" feature B in the Detailed Description encompasses examples where feature A is in contact with feature B, as well as examples where other layers and/or other components are positioned between feature A and feature B.

The terms "flexible" and "stretchable" and "bendable," including roots and derivatives thereof, when used as an adjective to modify electrical circuitry, electrical systems, and electrical devices or apparatuses, are meant to encompass electronics that comprise at least some components having pliant or elastic properties such that the circuit is capable of being flexed, stretched and/or bent, respectively, without tearing or breaking or compromising their electrical characteristics. These terms are also meant to encompass circuitry having components (whether or not the components themselves are individually stretchable, flexible or bendable) that are configured in such a way so as to accommodate and remain functional when applied to a stretchable, bendable, inflatable, or otherwise pliant surface. In configurations deemed "extremely stretchable," the circuitry is capable of stretching and/or compressing and/or bending while withstanding high translational strains, such as in the range of −100% to 100%, −1000% to 1000%, and, in some embodiments, up to −100,000% to +100,000%, and/or high rotational strains, such as to an extent of 180° or greater, without fracturing or breaking and while substantially maintaining electrical performance found in an unstrained state.

The encapsulated discrete "islands" or "packages" mentioned herein are discrete operative devices, e.g., arranged in a "device island" arrangement, and are themselves capable of performing the functionality described herein, or portions thereof. Such functionality of the operative devices can include, for example, integrated circuits, physical sensors (e.g. temperature, pH, light, radiation, etc.), biological sensors, chemical sensors, amplifiers, A/D and D/A converters, optical collectors, electro-mechanical transducers, piezoelectric actuators, light emitting electronics (e.g., LEDs), and any combination thereof. A purpose and an advantage of using one or more standard ICs (e.g., CMOS on single crystal silicon) is to use high-quality, high-performance, and high-functioning circuit components that are readily accessible and mass-produced with well-known processes, and which provide a range of functionality and generation of data far superior to that produced by passive means. The discrete islands may range from about, but not limited to, 10-100 micrometers (μm) in size measured on an edge or by diameter.

Examples described herein generally relate to systems and methods for encapsulating conformal electronics technology such as, for example, conformal sensors for sensing, measuring, or otherwise quantifying motion, including motion and/or muscle activity of at least one body part. In some examples, such conformal sensors can be configured to detect and/or quantify motion of a body part or other object. Such methods can help to increase the durability, comfort, and/or aesthetic appeal of the conformal electronic devices described herein, as well provide, for example, versatility, cost and scale-up capability.

According to at least some of the representative systems, methods, and apparatuses described herein, the example conformal sensors provide conformal sensing capabilities, providing mechanically transparent close contact with a surface (such as the skin or other portion of the body or the surface of an object) to improve measurement and/or analysis of physiological information of the body or other information associated with the at least one object. Conformal sensors of the example systems, methods, and devices described herein can be formed as patches. These patches are flexible and stretchable, and can be formed from conformal electronics and conformal electrodes disposed in or on a flexible and/or stretchable substrate. In various examples, the conformal electrodes can be formed integral with the conformal sensor, or can be made separable from the conformal sensor.

The example systems, methods and apparatuses described herein can be used with subjects that are humans or subjects that are non-human animals. The conformal sensors can be mounted to and caused to conform to, e.g., a portion of the skin or other portion of the body of the human or non-human animal, or the surface of an object.

Disclosed conformal sensor systems and devices can be used for sensing, measuring and/or otherwise quantifying at least one parameter associated with portions of the body or other object. In another example, the systems, methods, and apparatuses described herein can be configured to use the results of analysis of data indicative of at least one parameter associated with portions of the body or other object, for such applications as medical diagnosis, medical treatment, physical activity, sports, physical therapy and/or clinical purposes. Data gathered using at least some of the disclosed conformal sensors based on sensing the at least one parameter associated with portions of the body or other object, along with data gathered based on sensing other physiological measures of the body, can be analyzed to provide useful information related to medical diagnosis, medical treatment, physical state, physical activity, sports, physical therapy, and/or clinical purposes. When sensing is performed using thin, conformal, and wearable sensors described herein, or measurement devices with such sensors, these measures and metrics can be unimpeded by the size, weight or placement of the measurement devices.

Example systems, methods, and apparatuses described herein provide for creating, building, and deploying thin and conformal electronics that are useful in a wide variety of applications, both inside the body and outside the body. The example conformal sensors include silicon-based and other electronics in new form factors allowing the creation of very thin and conformal devices.

Example systems, methods, and apparatuses described herein including the conformal sensors can be configured to monitor the body motion and/or muscle activity, and to gather measured data values indicative of the monitoring. The monitoring can be performed in real-time, continuously, systematically, at different time intervals, and/or upon request. In addition, at least some of the systems, methods, and apparatuses described herein can be configured to store measured data values to a memory of the system and/or communicate (transmit) the measured data values to an external memory or other storage device, a network, and/or an off-board computing device. In any example herein, the external storage device can be a server, including a server in a data center. Non-limiting examples of computing devices applicable to any of the embodiments according to the principles herein include smartphones, tablets, laptops, slates, e-readers or other electronic reader or hand-held or worn computing device, an Xbox®, a Wii®, or other game system(s).

This example systems, methods, and apparatus can be used to provide ultra-thin and conformal electrodes that facilitate monitoring and diagnosis of subjects, including when combined with measurements of at least one parameter associated with portions of the body or other object. In combination with pharmaceuticals, this information can be used to monitor and/or determine subject issues including compliance with and/or effects of treatment regimens.

The example conformal sensors can be configured to provide a variety of sensing modalities. Example conformal sensors can be configured with sub-systems such as telemetry, power, power management, processing as well as construction and materials. A wide variety of multi-modal sensing systems that share similar design and deployment can be fabricated based on the example conformal electronics.

According to aspects of the disclosed concepts, conformal sensors can be configured to include electronics for performing measurements of at least a parameter of an object or a body part that is proximate to the conformal sensor. An example conformal sensor system can include electronics for performing at least one of an accelerometry measurements and a muscle activation measurement. In other examples, the conformal sensor system can include electronics for performing at least one other measurement, such as but not limited to heart rate measurements, electrical activity measurements, temperature measurements, hydration level measurements, neural activity measurements, conductance measurements, environmental measurements, and/or pressure measurements. For example, the conformal sensors can be configured to perform any combination of two or more of these different types of measurements.

Referring now to the drawings, wherein like reference numerals refer to like components throughout the several views, FIG. 1 illustrates a conformal electronics device, designated generally at 100, which includes a substrate 110, electronic circuitry 120, and an encapsulation layer 130. Conformal electronics device 100, for some implementations, is configured to provide conformal sensing and/or monitoring capabilities. The device 100 can provide mechanically transparent close contact with a surface (e.g., the skin or other portion of the body or the surface of an object) to improve measurement and/or analysis of physiological information of the body or other information associated with the at least one object.

The substrate 110 can, for example, be a soft, flexible, or otherwise stretchable substrate of non-conductive material that can conform to the contour of a surface on which the conformal electronics device 100 is disposed. Examples of such surfaces include, but are not limited to, a body part of a human or an animal or any other object. Suitable substrates 110 that can be used in the conformal electronics device 100 include, for example, a polymer or a polymeric material. Non-limiting examples of applicable polymers or polymeric materials include, but are not limited to, a polyimide (PI), a polyethylene terephthalate (PET), a silicone, or a polyurethane. Other non-limiting examples of applicable polymers or polymeric materials include plastics (including a thermoplastic, a thermoset plastic, or a biodegradable plastic), elastomers (including a thermoplastic elastomer, a thermoset elastomer, or a biodegradable elastomer), and fabrics (including a natural fabric or a synthetic fabric), such as but not limited to acrylates, acetal polymers, cellulosic polymers, fluoropolymers, nylons, polyacrylonitrile polymers, polyamide-imide polymers, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins, or any combinations of these materials. In an example, a polymer or polymeric material herein can be a UV curable polymer, such as but not limited to a UV curable silicone.

The substrate 110 can be formed using any suitable process including, for example, casting, molding, stamping, or any other suitable process. Furthermore, the substrate 110 can include other features, for example, holes, protrusions, grooves, indents, non-conducting interconnects, or any other features. In some examples, grooves, which can act as seats for device islands or interconnects, can be formed on the substrate 110.

Electronic circuitry 120 can be any suitable electronic circuitry that is operable, for example, to provide sensing, detecting, or otherwise quantifying at least one parameter associated with a subject or a surface (e.g., an animal or human body part or other object) on which the conformal electronics device 100 is disposed. For instance, the electronic circuitry 120 is configured to measure, detect, sense, or otherwise quantify motion, muscle activity, temperature (e.g., body temperature), pulse, moisture, pressure, and the like. The electronic circuitry 120 can include one or more sensor system(s), and one or more other component(s) (e.g., interconnects). The one or more sensor systems and one or more other component(s) are disposed on one or more device islands. The one or more device islands are arranged in a spatial configuration based on the desired dimensions and conformability of the overall resulting conformal electronic devices.

The one or more sensor systems included in the electronic circuitry 120 can include at least one component to perform at least one sensor measurement. Non-limiting examples of the at least one sensor measurement include an accelerometry measurement, a muscle activation measurement, a heart rate measurement, an electrical activity measurement, a temperature measurement, a hydration level measurement, a neural activity measurement, a conductance measurement, an environmental measurement, and/or a pressure measurement. As non-limiting examples, the sensor systems can include, one or more of an accelerometer (such as but not limited to a single-axis accelerometer or a 3-axis accelerometer), a gyroscope (such as but not limited to a 3-axis gyroscope), a nerve conduction study (NCS) component, an electromyography (EMG) component, an electroencephalogram (EEG) component, and/or an electrocardiogram (ECG) component.

Non-limiting examples of other components that can be included in the electronic circuitry 120 include at least one battery, a regulator, a processing unit, a memory (such as but not limited to a read-only memory, a flash memory, and/or a random-access memory), an input interface, an output interface, a communication module, a passive circuit component, an active circuit component, etc. In an example, the conformal electronics device 100 comprises at least one microcontroller and/or other integrated circuit component. In an example, the electronic circuitry 120 includes at least one coil, such as but not limited to a near-field communication (NFC) enabled coil. In another example, the electronic circuitry 120 includes a radio-frequency identification (RFID) component. In the same regard, the electronic circuitry 120 can include a dynamic NFC/RFID tag integrated circuit with a dual-interface, electrically erasable programmable memory (EEPROM).

The configuration of the device islands can be determined based on, e.g., the type of components that are incorporated in the overall electronic circuitry 120 (including the sensor system), the intended dimensions of the overall conformal electronics device 100, and the intended degree of conformability of the overall conformal electronics device 100. As a non-limiting example, the configuration of one or more device islands can be determined based on the type of overall conformal electronics device 100 to be constructed. For instance, the overall conformal electronics device 100 may be a wearable conformal electronics structure, or a passive or active electronic structure that is to be disposed in a flexible and/or stretchable object (including an inflatable or expandable surface of an interventional catheter). Optionally, the configuration of the device island(s) can be determined based on the components to be used in an intended application of the overall conformal electronics device 100. Example applications include a motion sensor, a temperature sensor, a neuro-sensor, a hydration sensor, a heart sensor, a flow sensor, a pressure sensor, an equipment monitor (e.g., smart equipment), a respiratory rhythm monitor, a skin conductance monitor, an electrical contact, or any combination thereof. One or more device islands can be configured to include at least one multifunctional sensor, including a temperature, strain, and/or electrophysiological sensor, a combined motion-/heart/neuro-sensor, a combined heart-/temperature-sensor, etc. Examples of electronic circuitry and conformal electronics devices including electronic circuitry are described in U.S. Provisional Patent Application No. 61/907,973, filed Nov. 22, 2013, and entitled "Configuration of Conformal Sensor Systems for Sensing and Analysis", which is incorporated herein by reference in its entirety and for all purposes.

The encapsulation layer 130 is disposed on at least a portion of the electronic circuitry 120 and at least a portion of the substrate 110 such that the encapsulation layer 130 envelops at least a portion of the electronic circuitry 120. In some configurations, such as that shown, encapsulation layer 130 is formed of a material that hermetically seals portions (e.g., surfaces) of the electronic circuitry 120 exposed by the substrate 110. Optionally, the encapsulation layer 130 can act as an "encapsulation housing" by enveloping most or all of the conformal electronics device 100. For some implementations, the encapsulation layer 130 is disposed on the device islands and interconnects of the electronic circuitry 120 hermetically sealing the device islands and interconnects. In such instances, the encapsulation layer 130 can include holes, apertures, or otherwise openings such that one or more sensors included in the electronic circuitry 120 are exposed (e.g., to contact a skin or body part of an animal or human, or any other object). Hermetically sealing at least a portion of the electronic circuitry 120 by the encapsulation layer 130 can help to protect the components of the electronic circuitry 120 from corrosive factors, including damage from corrosive chemicals, dust, moisture, oxidation, etc.

Encapsulation layer 130 of FIG. 1 can be formed from a soft, flexible, and non-conductive material. In some examples, the encapsulation layer 130 is formed from the same material as the substrate 110. In other examples, a different material can be used to form the encapsulation layer 130. Suitable materials that can be used in the encapsulation layer 130 include, for example, a polymer or a polymeric material. Non-limiting examples of applicable polymers or polymeric materials include, but are not limited to, a polyimide (PI), a polyethylene terephthalate (PET), a silicone, or a polyurethane. Other non-limiting examples of applicable polymers or polymeric materials include plastics (including a thermoplastic, a thermoset plastic, or a biodegradable plastic), elastomers (including a thermoplastic elastomer, a thermoset elastomer, or a biodegradable elastomer), and fabrics (including a natural fabric or a synthetic fabric), such as but not limited to acrylates, acetal polymers, cellulosic polymers, fluoropolymers, nylons, polyacrylonitrile polymers, polyimide-imide polymers, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins, or any combinations of these materials. In an example, the polymer or polymeric material can be a UV curable polymer, such as a ultraviolet (UV) curable silicone.

With continuing reference to FIG. 1, the encapsulation layer 130 can be formed using any suitable process, for example, casting, molding, stamping, or any other known or hereinafter developed fabrication methods. Furthermore, the encapsulation layer 130 can include a variety of optional features, such as holes, protrusions, grooves, indents, non-conducting interconnects, or any other features. By way of non-limiting example, encapsulation layer 130 can be formed using an overmolding process. In general, overmolding allows for a previously fabricated part to be inserted into a mould cavity an injection molding machine that forms a new plastic part, section, or layer on or around the first part. One such overmolding process includes directly casting a liquid material capable of forming the encapsulation layer 130 on the electronic circuitry 120 disposed on the substrate 110. The liquid material can then be cured (e.g., cool and solidify). Curing can be performed under any suitable conditions, for example, by applying pressure on the casted liquid material, heating the substrate, and/or applying a vacuum.

As another example, the electronic circuitry 120 can be embedded in the encapsulation layer 130 using a lamination process. For instance, the encapsulation layer 130 can be pre-casted into a sheet. A liquid adhesive (e.g., the uncured liquid material used to form the encapsulation layer, or any other suitable adhesive) can then be disposed on the electronic circuitry 120 and the substrate 110. The encapsulation layer 130 can be then disposed on the adhesive and pressure applied to squeeze out excess adhesive. The adhesive can then be cured to fixedly couple the encapsulation layer 130 to at least a portion of the electronic circuitry 120 and the substrate 130, thereby forming conformal electronics device 100 of FIG. 1.

According to aspects of the disclosed concepts, an adhesive material can be used during construction of encapsulated conformal electronic devices. Further to the options discussed above, the uncured liquid silicones used in the example lamination process can act as a type of adhesive, and harden, e.g., via curing (through crosslinking) to bind surfaces. In other examples, the electronic device components, including the device islands and electrical interconnects, can be affixed to a pre-cured sheet using a pressure sensitive adhesive prior to overmolding. A non-limiting example of a pressure sensitive adhesive is a rubber-based adhesive. In an example, in the construction of a patch including a sensor component (such as a temperature sensor or an electromagnetic radiation sensor (such as a UV sensor)), a pressure sensitive silicone transfer adhesive or a liquid silicone adhesive can be applied to the pre-cured sheet. Any adhesive described herein may be a sprayable or a brushable adhesive for application to a surface. An adhesive can aid in holding the electronic components in a specified position and arrangement, including in an archipelago arrangement, relative to other components of the system, during a subsequent overmolding process.

Adhesive materials can be used as a part of the lamination process during construction of an example device herein. For example, the electronic device components, including the device islands and/or the interconnects, can be affixed to a pre-cured base layer silicone sheet using a pressure sensitive silicone adhesive prior to applying the top layer of silicone sheet, with an uncured liquid silicone used for lamination. In other examples, the lamination can also be completed using a pressure sensitive silicone adhesive to embed an ultrathin electronics device between silicone sheets. The lamination can be based on use of a film adhesive that does not require a curing process.

Encapsulation layer 130 and/or base substrate 110 of FIG. 1 can be configured to facilitate modulation of a stress or a strain that might be caused in a portion of the conformal electronics device 100, for example, due to stretching, bending, compressing, torsion, or other deformation. As an example, there can be a concentration of stress and/or strain at a transition from a more rigid portion of a system (e.g., a device island) to a more compliant structure (e.g., a flexible and/or stretchable component) when the conformal electronics device 100 is subjected to a deformation. Other areas of stress concentration can include, for example, edges of interconnects, or boundaries where an interconnect is coupled to a device island. Encapsulation layer 130 can be formed from a material that is configured to have a thickness and/or disposed locally on portions of the electronic circuitry 120 such as to minimize the stress on the components of the electronic circuitry 120 by adjusting the location of a neutral mechanical plane relative to a functional component of the electronic circuitry. For example, the material used to form the encapsulation layer 130 can be introduced locally in a region of a component of the electronic circuitry 120, such as proximate to the portion of the component of the electronic circuitry 120. The locally disposed encapsulation layer protects the component from applied stresses/strains in the event of a deformation force being applied to the overall conformal electronics device 100 by adjusting the location of the neutral mechanical plane locally in the region of the component. Controlled placement of the neutral mechanical plane relative to a functional component can result in little to no stress or strain being exerted in the region of the component, when the conformal electronics device 100 is subjected to a deformation force.

In the embodiment illustrated in FIG. 1, the encapsulation layer 130 and/or substrate 110 can have an ultrathin thickness and have favorable mechanical and optical properties. Optionally, the encapsulation layer 130 can have a thickness in the range of about 0.05 mm to about 0.5 mm. Moreover, the encapsulation layer 130 and/or the substrate 110 can have an elongation in the range of about 200% to about 800% or, for some configurations, about 300%, about 400%, about 500%, about 600%, or about 700%, relative to the undeformed length of the encapsulation layer 130/substrate 110. In some examples, the encapsulation layer 130 and/or the substrate 110 have a tear strength of about 40 pounds per inch (ppi) to about 200 ppi or, for some configurations, about 60 ppi, about 80 ppi, about 100 ppi, about 120 ppi, about 140 ppi, about 160 ppi, or about 180 ppi. As another option, the encapsulation layer 130 and/or the substrate 110 can have a hardness measured by a durometer of about 10 A (e.g., according to the Shore A Hardness Scale) to about 60 A to higher, for example, about 20 A, about 30 A, about 40 A, about 50 A or about 60 A. For some configurations, the encapsulation layer 130 and/or the substrate 110 can have an optical transparency of greater than about 90% between wavelengths of light about 350 nm to about 1,000 nm. The total thickness of encapsulated conformal electronics device 100 (e.g., at its thickest point) can be in the range of about 0.20 mm to about 1.0 mm. For some configurations, the encapsulation layer 130 and/or the substrate 110 can be transparent. In other examples, the encapsulation layer 130 and/or the substrate 110 can be translucent or colored. In some examples, a conformal electronic device can be encapsulated using a plurality of thin encapsulation layers.

Figure 2:
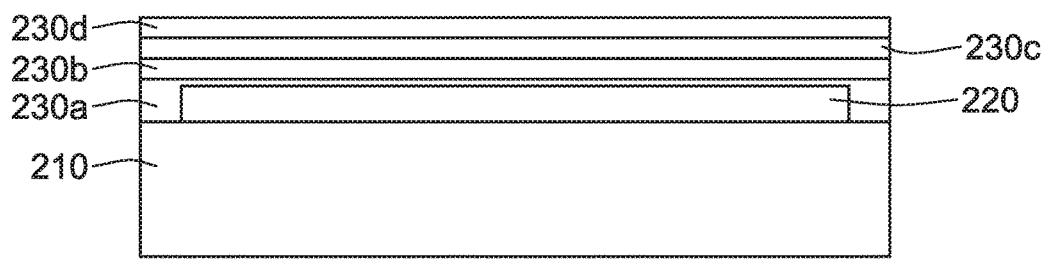
FIG. 2 is a side-view illustration of an example of a conformal electronics device with multiple encapsulation layers in accord with aspects of the present disclosure.

Referring next to FIG. 2, a representative encapsulated conformal electronics device is shown in accordance with aspects of the present disclosure. Similar to the device architecture presented in FIG. 1, conformal electronics device 200 of FIG. 2 includes, as some non-limiting examples, electronic circuitry 220 that is coupled to a substrate 210. The substrate 210 and the electronic circuitry 220 can be substantially similar to the substrate 110 and the electronic circuitry 120, respectively, described with respect to the conformal electronics device 100. For example, the substrate 210 and the electronic circuitry 220 can each take on any of the various forms, optional configurations, and functional alternatives described above with respect to the corresponding structure illustrated in FIG. 1.

A series of encapsulation layers—first, second, third and fourth encapsulation layers 230a, 230b, 230c and 240d, respectively (collectively referred to as "encapsulation layers") in FIG. 2—are disposed sequentially on the substrate 210 and circuitry 220, with the top three layers 230b-d operating to strengthen the first encapsulation layer 230a. Each encapsulation layer 230a-d can be an ultrathin layer, for example, having a thickness in the range of about 0.05 mm to about 0.5 mm. The encapsulation layers 230a-d of FIG. 2 can be formed from any of the materials described above with respect to conformal electronics device 100 of FIG. 1. While shown as having four encapsulation layers 230a-d, any number of encapsulation layers can be used to encapsulate the device 200. Moreover, while FIG. 2 shows each of the encapsulation layers covering the entire width of the device 200, in some examples, one or more of the various encapsulation layers 230a-d can be disposed on only a portion of the electronic circuitry 220 and/or the substrate 210. For example, one or more of the plurality of encapsulation layers 230a-d can be disposed in proximity to an area of stress/strain concentration (e.g., a device island or edges of interconnects), thereby adjusting the location of a neutral mechanical plane relative to a functional component of the electronic circuitry.

FIGS. 3A and 3B show the mechanical layout and system-level architecture of an example conformal electronics device, designated 300, configured as a rechargeable patch. The example conformal sensor system electronics technology can be designed and implemented with various mechanical and electrical layouts for single-function and multifunctional platforms. Devices including the conformal electronics technology integrate stretchable form factors using designs embedded in polymeric layers. These can be formulated to protect the circuits from strain and to achieve mechanical flexibility in an ultra-thin cross-section. For example, the device can be configured with thicknesses on the order of about 1 mm on average. In other examples, the patch can be configured with thinner or thicker cross-sectional dimensions. The device architecture can include a reusable module containing surface-mount technology (SMT) components, including as some non-limiting examples, a sensor module 302 (e.g., a triaxial accelerometer), a wireless communication (e.g., Bluetooth®) and microcontroller (MCU) module 304, and conformal electrode array modules 312 and 314 for sensing, e.g., EMG, EEG and EKG signals, with electrode connectors 313. The conformal electrode arrays can be disposable 310 and 312. The example device can also include a power supply 316 (such as a LiPo Battery of power 2 mA-Hr or 10 mA-Hr), a regulator 318, a power transfer coil 320 (such as but not limited to a 0.125 oz Cu coil with 1.5/2 mil trace/space ratio), and a memory 322.

Figure 3:
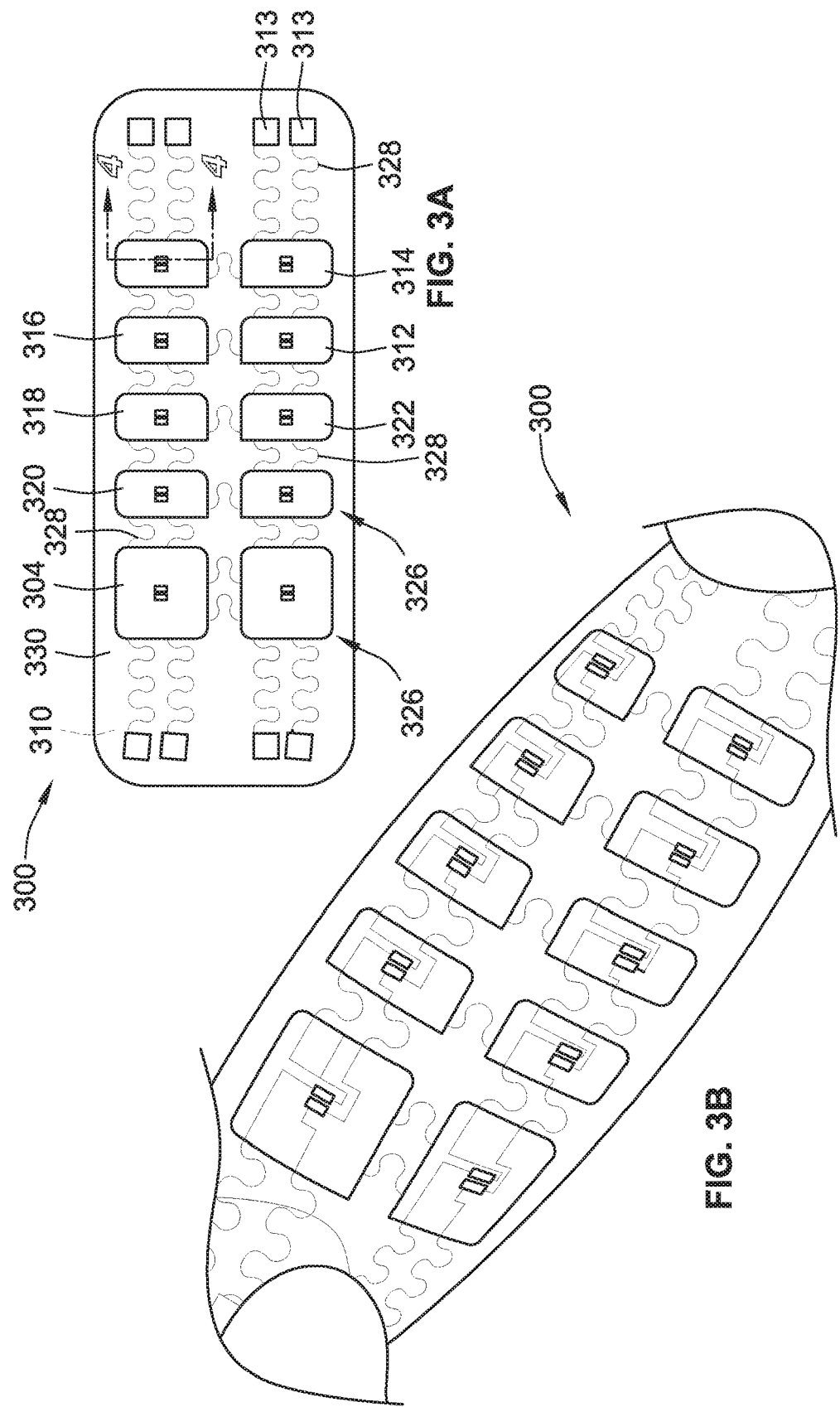
FIGS. 3A and 3B are plan-view and perspective-view illustrations, respectively, of an encapsulated conformal electronics device in accord with aspects of the present disclosure.

As shown in the example of FIGS. 3A and 3B, the components of the example conformal sensor system 300 are configured as device islands interconnected by stretchable interconnects 328. Stretchable interconnects 328 can be electrically conductive to facilitate electrical communication between the components, or electrically non-conductive to assist in maintaining a desired overall form factor or relative aspect ratio of the overall conformation of the conformal sensor device during or after being subjected to deformation forces, such as but not limited to extension, compressive and/or torsional forces. The example of FIG. 3 also shows the differing shapes and aspect ratios of the island bases 326 that the components of the example conformal sensor system can be disposed on, or otherwise coupled to, to provide the to provide the necessary functionality of the overall system.

Conformal electronics device 300 of FIGS. 3A and 3B comprises a flexible substrate 310, such as flexible substrates 110 and 210 of FIGS. 1 and 2, respectively, to which is coupled the electronic circuitry. Substrate 310 and electronic circuitry are at least partially encapsulated by a flexible encapsulating layer 330. Electronic circuitry included in the conformal electronics device 300 includes a plurality of device islands (ten of which are shown in the drawing, two of which are designated at 326) that are electronically coupled together via serpentine interconnects 328. In some example implementations, such as illustrated in FIGS. 3A-3B, a plurality of contacts may be disposed at either or each end of the conformal electronics device 300. In other example implementations, the conformal electronic device does not include such contacts. The device islands can include any number of interconnects and any number of components as described with respect to conformal electronics device 100 or any other conformal electronic devices described herein.

Figure 4:
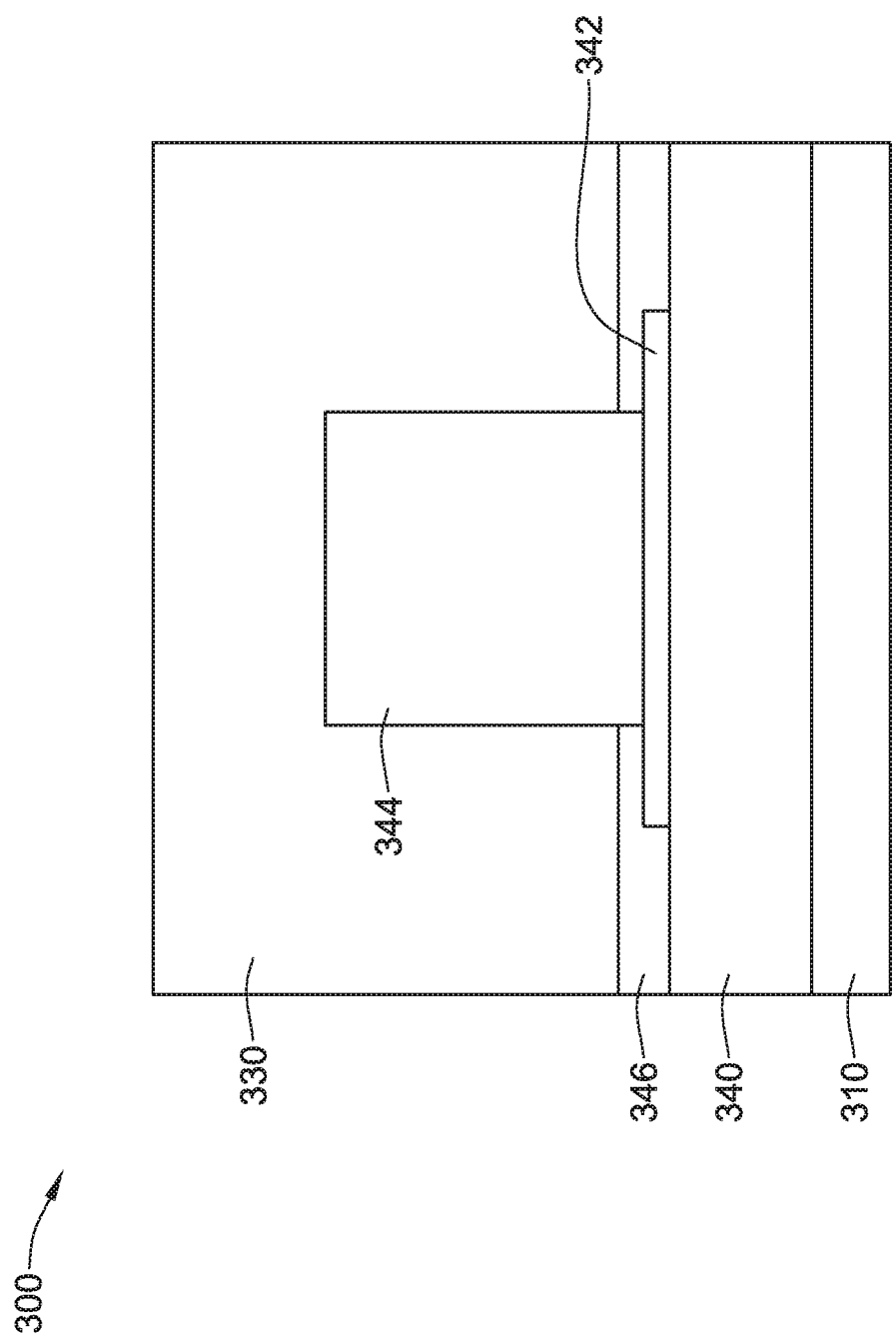
FIG. 4 is a cross-sectional side-view illustration of a portion of the conformal electronics device presented in FIGS. 3A and 3B taken along line 4-4 in FIG. 3A.

FIG. 4 shows a cross-section of a portion of the conformal electronics device 300 taken along line 4-4 in FIG. 3A. As seen in FIG. 4, the device 300 includes a substrate 310 providing subjacent support for a base plate 340 disposed on the substrate 310. Substrate 310 can be formed from, for example, RTV silicone or any other suitable substrate material described herein. In some examples, the substrate 310 can have a thickness of about 200 μm. In some examples, the base plate can be formed from polyimide and, optionally, can have a thickness of about 50 μm. One or more electrical contacts 342 are disposed on the base plate 310 and coupled to the electronic component 344. The electronic component 344 can be any component described with respect to the conformal electronics device 100, or any other electronic components described herein. For some configurations, the electronic component 344 has a thickness of about 500 μm. The electrical contact(s) 342 can be formed from any suitable electrically conductive material, such as copper. Electrical contact(s) 342 can have a thickness of about 0.5 μm. Select (upper and side) portions of the electrical contact 342 not coupled with the electronic component 344 are covered with an insulating layer 346.

An encapsulation layer 330 is disposed on the substrate 310 such that the encapsulation layer completely encapsulates the entire conformal electronic device 300 (or substantially all of the device). In some examples, the encapsulation layer 330 can be formed from RTV silicone or any other encapsulation material described herein. While the conformal electronic device 300 is shown and described as having certain components, the conformal electronics device 300 can include any of the other components described herein which can be configured to perform any suitable function as described herein. For some example architectures, the encapsulating layer 330 is configured to define an ultrathin thickness such that the thickness of the encapsulation layer 330, as measured from a distal end of the electronic component, is approximately 200 μm. In such examples, the conformal electronic devices have an ultrathin profile, e.g., having a maximum thickness at its thickest point of less than about 2 mm or, in some embodiments, less than about 1 mm.

As shown in FIG. 4, the encapsulating layer 330 can be disposed locally over, or proximate to, a portion of the base plate 340, electronic component 344, and/or an interconnect 328. For example, the encapsulating layer can be disposed over, or proximate to, portions of the overall conformal electronic device 300 device structure, including one or more electronic components, base plates, and/or interconnects. An encapsulation material can be introduced locally in a region of a portion of a component of the conformal electronic device 300, such as proximate to the portion of the component, to protect the component from an applied stress or strain in the event of a deformation force being applied to the overall conformal device. For example, the encapsulation material can aid in adjusting a location of a neutral mechanical plane locally in the region of the component. Controlled placement of the neutral mechanical plane relative to a functional component can result in cause little to no stress or strain being exerted in the region of the component, when the overall conformal electronic device 300 is subjected to the deformation force.

With continuing reference to FIG. 4, base plate stiffness can result in the interconnect coupled to the base plate being subjected to a greater amount of plastic strain on deformation, e.g., a stretching. As a non-limiting example, a base plate formed from a polyimide (PI) or a polyethylene terephthalate (PET) can have a value of modulus of about 6.894 MPa and a C10 (a hyper-elasticity material constant) of about is 0.925 MPa. In determining the configuration of the overall conformal device, the dimensions of, and/or stiffness of the material of, the base plate can be considered, in conjunction with the stiffness properties and/or placement of the encapsulant material, can be controlled to strategically to urge the neutral mechanical plane to fall in a region of the overall conformal device to prevent such a strain concentration near the passive component and/or the interconnects.

Also disclosed herein are methods for making and methods for using encapsulated conformal electronic devices. Some of these methods will be described with reference to the various configurations and features shown in FIGS. 1 through 4 of the drawings; such reference is being provided purely by way of explanation and clarification. In some embodiments, such as those shown in FIGS. 5, 6 and 14, each method includes at least those steps enumerated in its respective figure. It is also within the scope and spirit of the present disclosure to omit steps from each method, include additional steps in each method, and/or modify the order presented. It should be further noted that each of the foregoing methods can be representative of a single sequence of related steps; however, it is expected that each of these method will be practiced in a systematic and repetitive manner.

Figure 5:
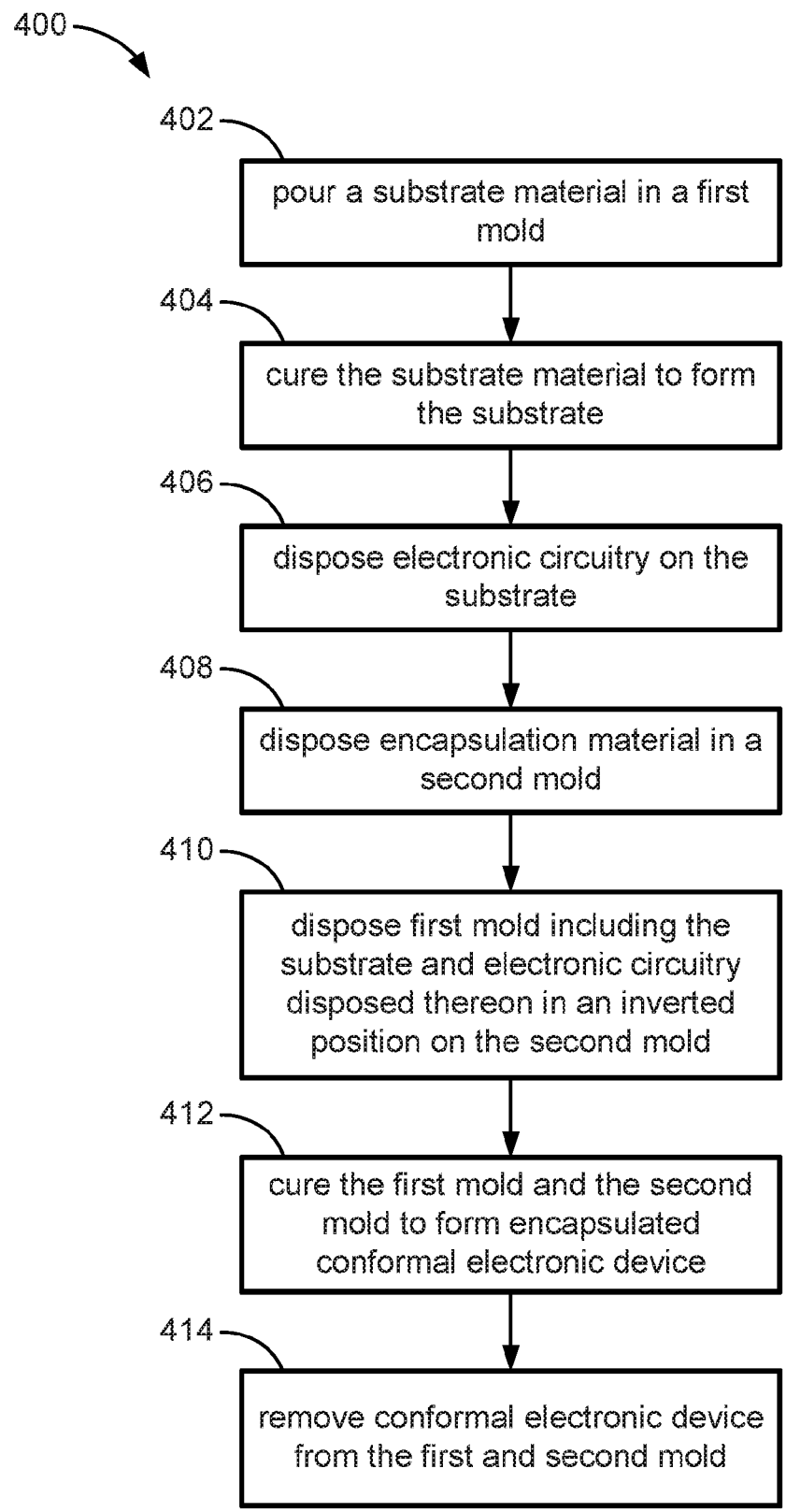
FIG. 5 is a process flowchart illustrating an exemplary method for encapsulating a conformal electronic device using an overmolding process in accord with aspects of the present disclosure.

FIG. 5 presents a flow diagram showing an exemplary method 400 for encapsulating a conformal electronic device, such as the conformal electronics device 100 and 200 of FIGS. 1 and 2, or any other conformal electronic device described herein, using overmolding. The method 400 begins at Block 402 with disposing a substrate material into a first mold. The substrate material can include, for example, any of the materials used to form the substrate 110, substrate 210, or any other substrate described herein. Before disposing the substrate material into the first mold, the first mold can be cleaned using any suitable process. In some examples, a release layer, such as wax, oil, soapy water, or any other suitable release layer, is disposed on the first mold before adding the substrate material. The release layer can allow for easy removal of the substrate from the first mold after curing.

At Block 404, the substrate material is cured to form a soft and flexible substrate. Any suitable curing process can be used. For example, a positive pressure can be applied on the first mold, the first mold can be heated to a predetermined temperature, and/or a vacuum can be applied on the first mold. Electronic circuitry is next disposed on the cured substrate at Block 406. The electronic circuitry can include, for example, the electronic circuitry 120, electronic circuitry 220, or any other electronic circuitry described herein, including those identified in FIG. 3A. An encapsulation material is disposed in a second mold at Block 408 of the method 400 in FIG. 5. The encapsulation material can include, for example, the materials used for forming the encapsulation layer 130, encapsulation layer 230, or any other encapsulation materials described herein. In some examples, a release layer, such as wax, oil, soapy water, or any other suitable release layer, is disposed on the second mold before adding the encapsulation material. The release layer allows for easy removal of the encapsulation material from the second mold after curing.

Continuing with the exemplar method of FIG. 5, Block 410 includes positioning the first mold, which includes the substrate and the electronic circuitry disposed on the substrate, in an inverted position (e.g., upside down) on the second mold. The first mold and the second mold are then cured to form the encapsulated conformal electronic device at Block 412. Any suitable curing process can be used. For instance, a positive pressure can be applied on the first mold and the second mold, the first mold and the second mold can be heated to a predetermined temperature, and/or a vacuum can be applied on the first mold and the second mold. After curing, the encapsulated conformal electronic device can be removed from the first mold and the second mold at Block 414.

Figure 6:
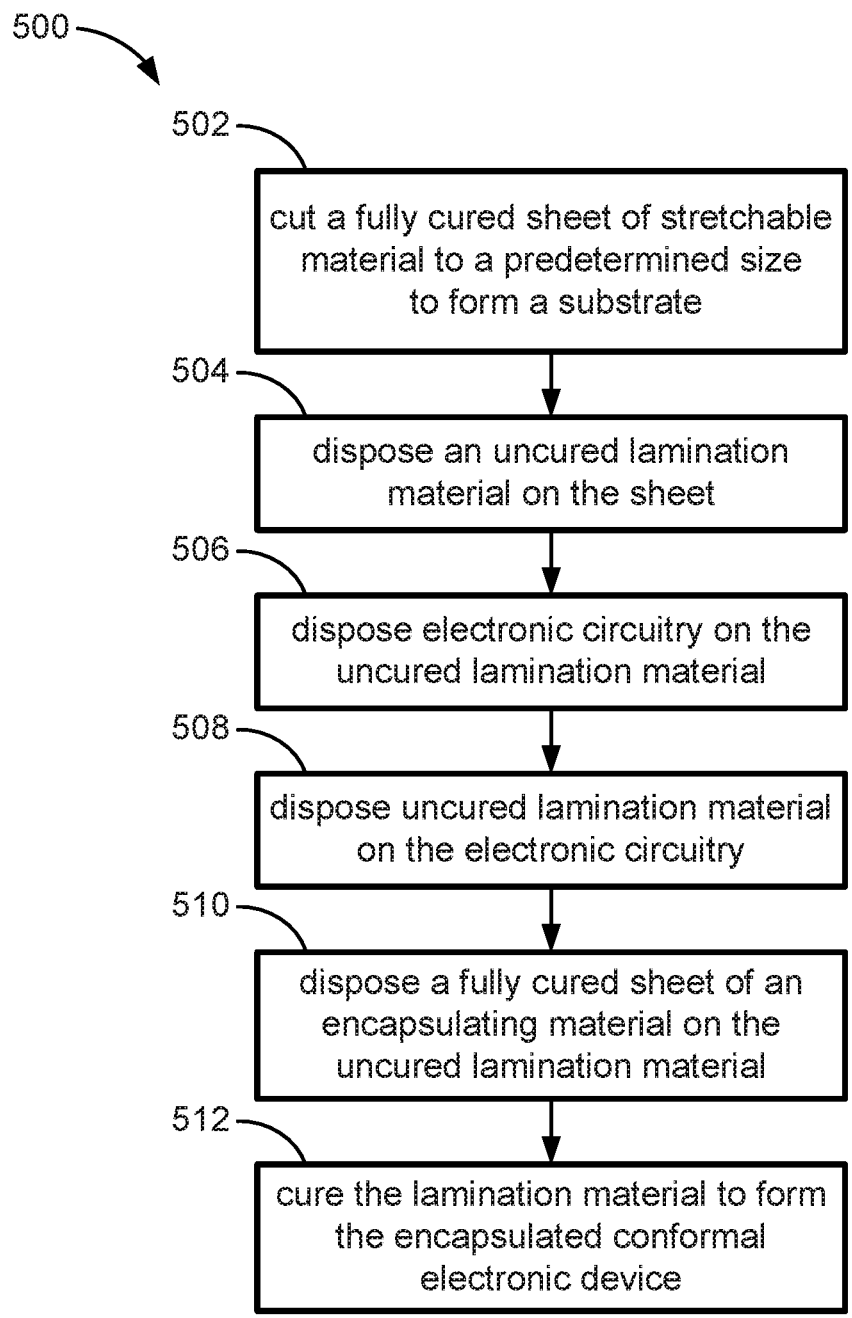
FIG. 6 is a process flowchart illustrating a representative method for encapsulating a conformal electronics device using a lamination process in accord with aspects of the present disclosure.

FIG. 6 is a flow diagram showing an exemplary method 500 for encapsulating conformal electronic devices, such as the conformal electronics device 100, 200, or any other conformal electronic device described herein, using lamination. The method 500 of FIG. 6 begins at Block 502 with cutting a fully cured sheet of a stretchable material to a predetermined size to form a substrate. The stretchable material can include any of the materials described with respect to the substrate 110, substrate 210, or any other stretchable materials described herein. An uncured lamination material is then disposed on the stretchable material at Block 504. The lamination material can include any suitable material, for example, the stretchable material used to form the substrate described herein. In some examples, the lamination material can include the material used to form an encapsulation layer.

Next, at Block 506, electronic circuitry is disposed on the uncured lamination material. The electronic circuitry can include the electronic circuitry 120, electronic circuitry 220, or any other electronic circuitry described herein. Excess amounts of the uncured lamination material is then disposed on the electronic circuitry, e.g., at Block 508, such that the electronic circuitry is completely covered with the lamination material. A sheet of a fully cured encapsulating material (i.e., the encapsulation layer) is disposed on the uncured lamination material at Block 510. The encapsulation layer can be formed from any of the encapsulation materials described with reference to the encapsulation layer 130, or any other encapsulation materials described herein. Pressure can be applied on the encapsulation layer to remove excess lamination material. The encapsulation material is then cured to form the encapsulated conformal electronic device at Block 512. Any suitable curing process can be used. For example, a positive pressure, heat or a vacuum can be used to cure the lamination material. Curing the lamination layer couples together the substrate sheet, the electronic circuitry, and the encapsulation sheet to form the encapsulated conformal electronic device.

The following are some representative implementations that show examples of various encapsulated conformal electronic devices formed using processes and methods according to the principles described herein. These examples are only for illustrative purposes and are not intended to limit the scope of the present disclosure.

EXAMPLE 1

In this example, a conformal electronic device—hereinafter "Ex 1 Device"—which includes moisture sensors is encapsulated using an overmolding process. The Ex 1 Device is encapsulated to have a final thickness of about 6 mm for higher thickness measurements, or a final thickness of about 2 mm for water-proof capability measurements. Three plate-molding tools—first plate 701, second plate 702, and third plate 703—are used for the overmolding process and are shown in FIGS. 7A-7F. The plate surfaces shown in FIGS. 7A, 7C and 7E are used to form a cap for an opening for a connector on a portion of the Ex 1 Device for the higher thickness measurements, while the plates shown in FIGS. 7B, 7D and 7F are used to form an encapsulation layer for a water-proof capability measurement. A Model 44-226 25-Ton 5"-Stroke Self-leveling laboratory Hydraulic Press available from the Dake Corporation can be used for the foregoing molding processes. Two different encapsulation materials can be used for the higher thickness measurement and the water-proof capability measurement. In an example, for the higher thickness measurements, ECOFLEX® from SMOOTH-ON™ can be used to form the encapsulation layer. In an example, for the water-proof capability measurements, Bluestar SILBIONE® RTV4545 silicone can be used to form the encapsulation layer. Optionally, other suitable materials (e.g., Bluestar SILBIONE® LSR4325) can be used to form the encapsulation layer and/or to improve the water-proof capability of the encapsulation layer. Example primers that can be used are MED-142 and MED-166 from Nusil Silicone Technology. These primers can substantially increase the adhesion of the encapsulation material to a surface on which the primer is applied.

The precursors of encapsulation material (e.g., ECOFLEX® or SILBIONE® RTV4545) are mixed according to the manufacturer's instructions, degassed under vacuum, and stored at approximately 4 degrees Celsius prior to use. The molding plates 701-703 can be sprayed with a cleaning fluid, such as dilute soapy water or alcohol, for easy release of the molded layers. The mixed encapsulating material is then poured into the molding cavities 710 of plate 702. Plate 701 is disposed on plate 702 to form a first closed mold assembly, and the assembly is disposed in the press for approximately 30 minutes at about 20,000 psi of pressure and a temperature of about 110 degrees Fahrenheit. After 30 minutes, the assembly is removed from the press. Plate 701 is removed leaving a first sheet of encapsulation material disposed on Plate 702. The first sheet is used as a substrate for the Ex 1 Device. Excess flash of the encapsulation material is cleaned.

Next, the Ex 1 Device that includes the moisture sensors is cleaned with alcohol. Primer is applied on the electronic circuitry and is allowed to dry for approximately 30 minutes. The cleaned Ex 1 Device is then disposed on the substrate. The mixed encapsulating material is poured into the molding cavities 712 of Plate 703. Plate 702 is then carefully and slowly placed on top of Plate 703 such as to allow trapped air to exit and to form a second closed mold assembly. The second assembly is placed in the press and maintained for about 30 minutes at a pressure of about 20,000 psi and a temperature of about 110 degrees Fahrenheit to form the encapsulated Ex 1 Device. Optionally, much lower pressures can be used, including assembly at near atmospheric pressure, e.g., when there is a potential that using a higher pressure could damage any of the electronic device components of the structure. Using a low pressure encapsulation process during overmolding and lamination can achieve high yield. In some examples, temperatures other than about 110 degrees Fahrenheit can be used to form the encapsulation layer of an example device. The encapsulated device is removed from the mold and excess material removed.

Figure 8B:
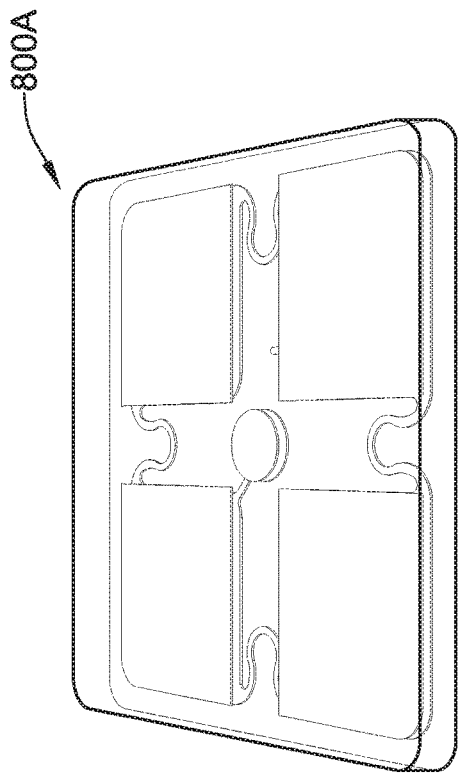
FIG. 8A-8D are perspective-view illustrations of various encapsulated conformal electronics devices in accord with aspects of the present disclosure.
Figure 8D:
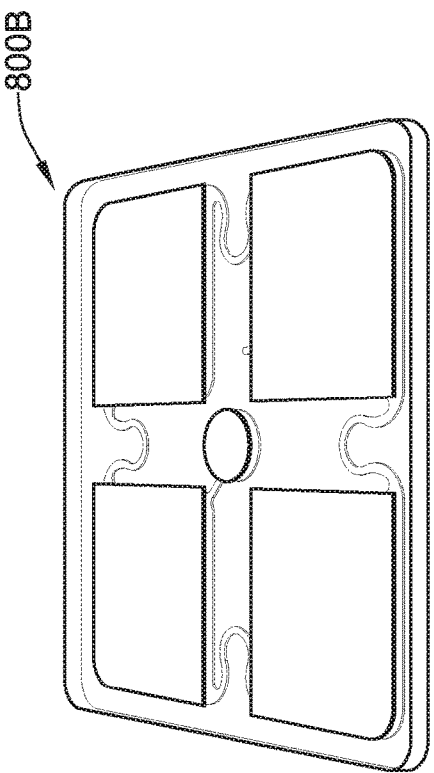
Figure 8A:
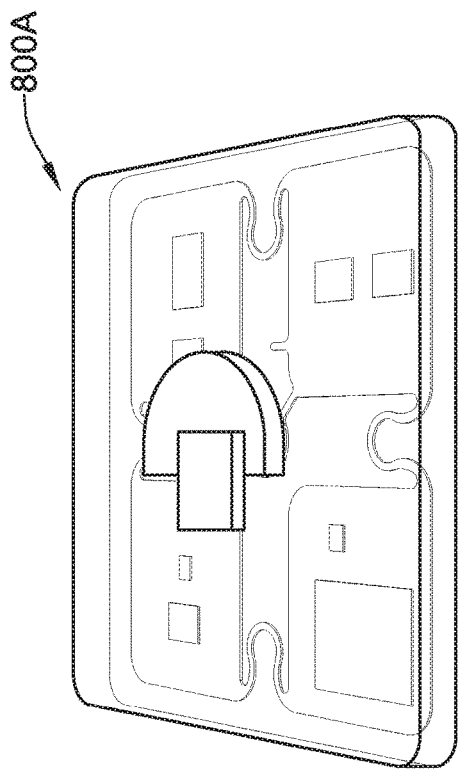
Figure 8C:
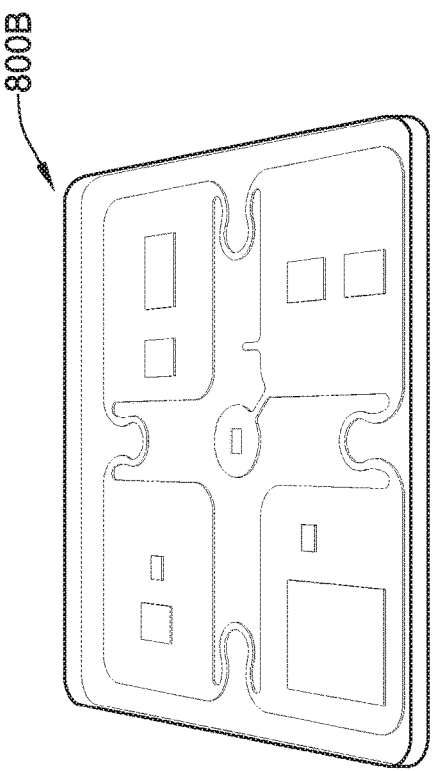

FIGS. 8A-8D are perspective-view illustrations of various encapsulated conformal electronics devices in accord with aspects of the present disclosure. FIGS. 8A and 8B, for example, show a top view and a bottom view, respectively, of a first example of the Ex 1 Device, designated generally at 800A, encapsulated for higher thickness measurements. The overall thickness of Ex 1 Device 800A, as shown, is approximately 5.85 mm. The encapsulation layer is smooth, soft and defect free. FIGS. 8C and 8D, in contrast, show a top view and a bottom view, respectively, of a second example of the Ex 1 Device, designated generally at 800B, encapsulated for water-proof capability measurements. The overall thickness of the device 800B is approximately 2.2 mm and the thinnest layer is about 0.21 mm. Defects, such as tears and delaminated sections, may appear on the edges and/or the bottom side of the encapsulated device where the encapsulation layer is thinner.

EXAMPLE 2

An overmolding process is used to encapsulate a conformal electronic device-hereinafter "Ex 2 Device"—that includes device islands and interconnects. The Ex 2 Device, for at least some embodiments, is similar or substantially identical to the conformal electronics device 200 and/or 300 described with respect to FIGS. 2 and 3A-B, and thus can include any of the corresponding options and features discussed with reference thereto. The Ex 2 Device is then encapsulated using substantially the same overmolding process used to encapsulate the Ex 1 Device. In this example, the encapsulation material used is Bluestar SILBIONE® RTV4545. In other examples, alternative encapsulation materials can be used in forming the Ex 2 Device. As shown, the encapsulated Ex 2 Device has a total thickness of about 1 mm. FIGS. 9A and 9B show the top and the bottom of a representative embodiment 900 of the encapsulated Ex 2 Device. Some air bubbles may be visible in the encapsulation layer and some delamination may occur at or proximate to the device islands without denigrating the functionality of the Ex 2 Device.

EXAMPLE 3

In this example, a lamination process is used to encapsulate a moisture-sensing conformal electronic device—hereinafter "Ex 3 Device." The Ex 3 Device, in at least some embodiments, is similar or substantially identical to the Ex 1 Device, and thus can include any of the corresponding options and features discussed with reference thereto. The Ex 3 Device is encapsulated to have a thickness of about 1.0 mm to about 1.5 mm for water-proof and reliability measurements.

The surfaces of the unencapsulated Ex 3 Device are cleaned, in this example, using a DOW CORNING® OS20™ cleaning fluid or other suitable cleaning material, and then allowed to dry. As a non-limiting example, the surfaces of the Ex 3 Device are coated with a thin layer of DOW CORNING 1200® OS™ primer using a lint-free towel and allowed to cure in ambient air for at least about 1 hour. The adhesive material used can be a two part (part A and B) liquid silicone, such as SORTA-CLEAR 18® (SMOOTH-ON™), or any other equivalent polymer having medium viscosity can also be used. The part A precursor and the part B precursor of the liquid silicone are mixed together, for example, in a ratio of about 10:1, degassed under vacuum and stored at a temperature of about 4 degrees Celsius prior to use. Silicone rubber sheets (e.g., Rogers Corp, HT-6240 having a thickness of about 0.25 mm, or GELPAK® PF-60-x4 having a thickness of about 0.15 mm) are cut into pieces having dimensions of about 5 cm by 6 cm. One side of the liner of the silicone rubber sheets is removed. A thin layer of liquid silicone is disposed on a first silicone rubber sheet using a brush. The first silicone sheet is used as the base layer.

Figure 10A:
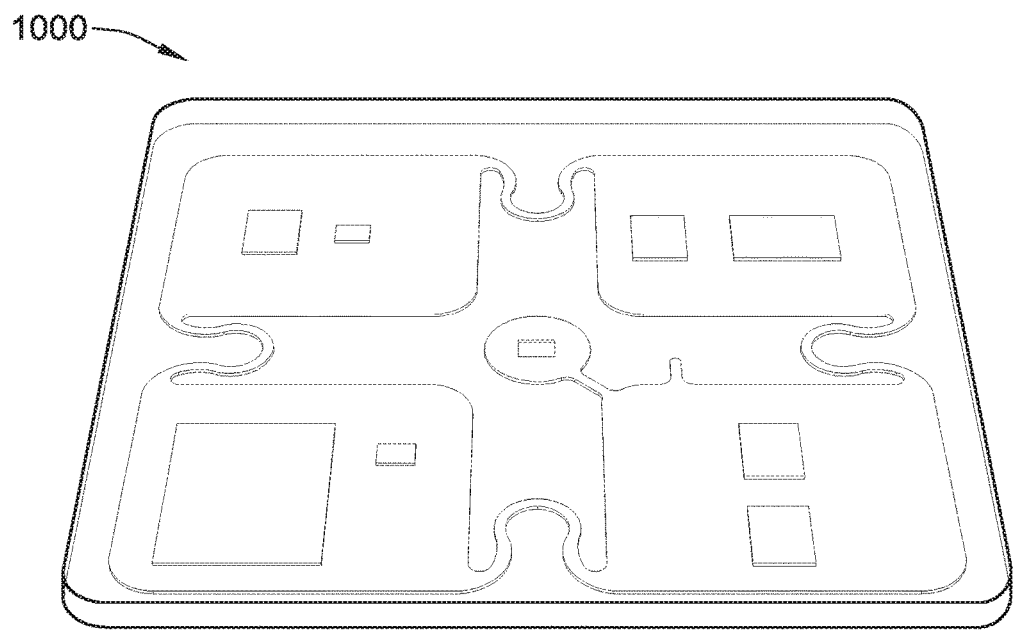
FIGS. 10A and 10B are top and bottom perspective-view illustrations, respectively of another encapsulated conformal electronics device in accord with aspects of the present disclosure.
Figure 10B:
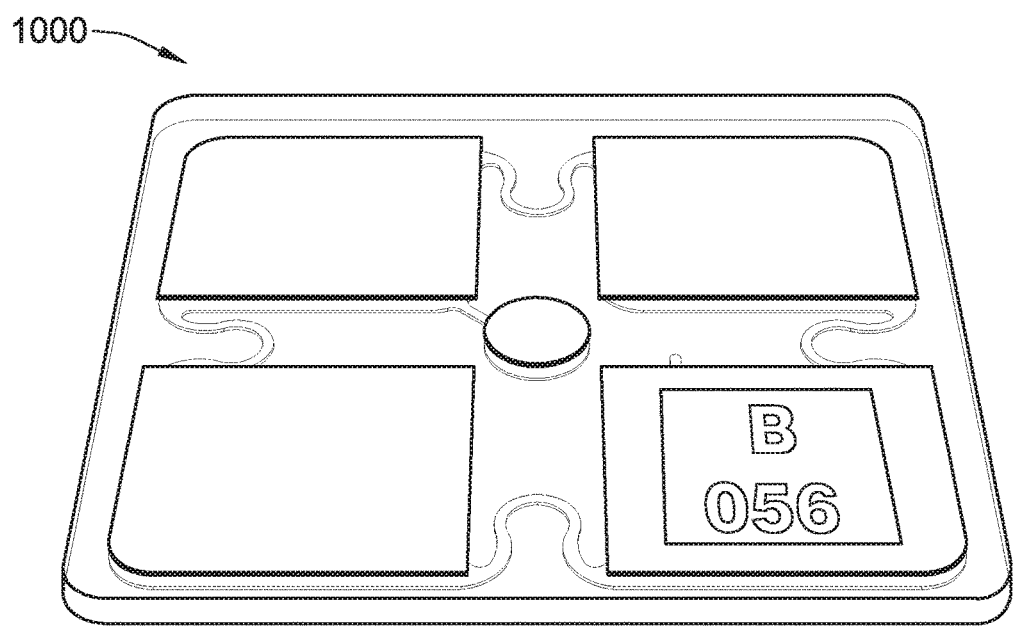

The Ex 3 Device is disposed on the first sheet and an excess amount of liquid silicone is deposited on the Ex 3 Device. A second sheet of silicone is disposed over the Ex 3 Device and the first sheet of silicone, such that the Ex 3 Device is sandwiched or laminated between two sheets of silicone. Pressure can be applied using a roller to remove excess liquid silicone. The laminated Ex 3 Device is cured for at least about 5 hours while maintained at a pressure of about 20-30 pounds. In this example, the curing is continued for about 24 hours to fully cure the liquid silicone. In another example, the curing process can be accelerated to 5 minutes at ambient temperature by using a fast cure silicone such as but not limited to ECOFLEX® 5. The encapsulated Ex 3 Device can be cut into individual sample patches using a scalper. FIGS. 10A and 10B show the top and the bottom, respectively, of a representative embodiment 1000 the encapsulated Ex 3 Device. The thickness of the illustrated Ex 3 Device, at various locations, can range from about 0.33 mm to about 2.13 mm when the 0.15 mm thick silicone sheets are used, or range from about 0.6 mm to about 2.33 mm when the 0.25 mm thick silicone sheets are used.

EXAMPLE 4

Another representative conformal electronic device—referred to hereinafter as "Ex 4 Device"—is encapsulated using a lamination process. In this configuration, Ex 4 Device includes embedded Near Field Communication (NFC) microchips. The liquid silicone used for the lamination procedure is Bluestar SILBIONE® RTV4545 which has low viscosity. The Ex 4 Device is encapsulated using substantially the same lamination procedure as the Ex 3 Device. FIGS. 9A and 9B can therefore be representative of the top and bottom, respectively, of the encapsulated Ex 4 Device. The thickness of the Ex 4 Device at various locations is less than about 0.7 mm when the 0.15 mm thick silicone sheets are used, and is thickness is less than about 1 mm when the 0.25 mm thick silicone sheets are used.

EXAMPLE 5

Figure 11A:
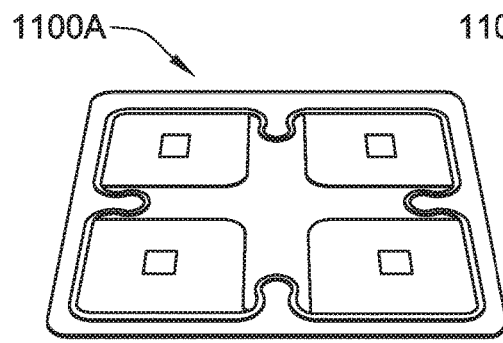
FIGS. 11A-11H are top and bottom perspective-view illustrations of various other encapsulated conformal electronics devices in accord with aspects of the present disclosure.
Figure 11B:
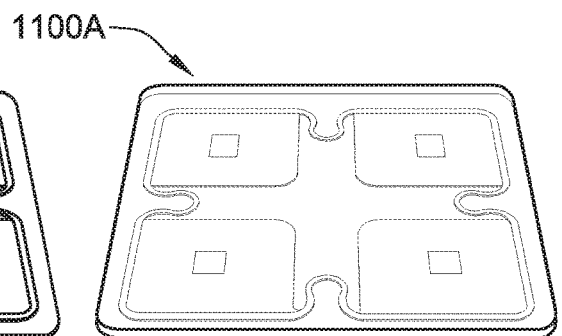
Figure 11C:
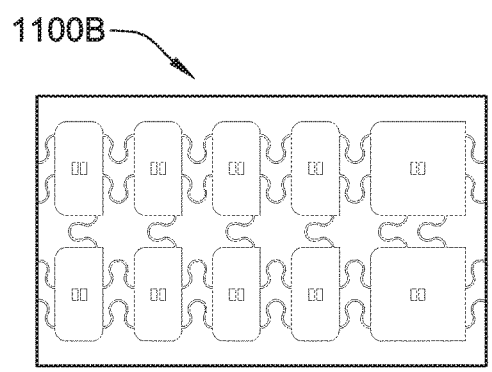
Figure 11D:
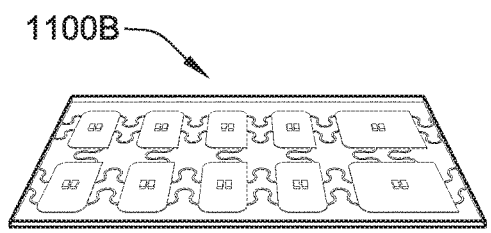
Figure 11E:
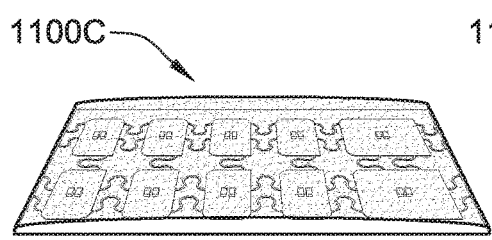
Figure 11F:
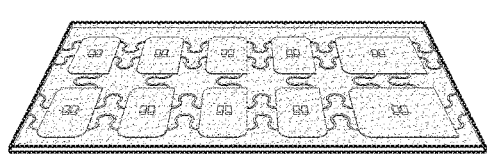
Figure 11G:
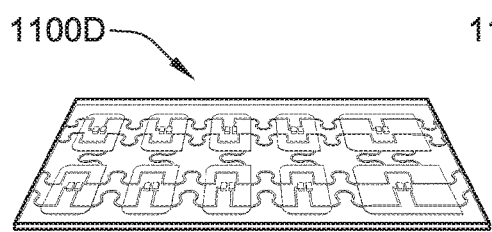
Figure 11H:
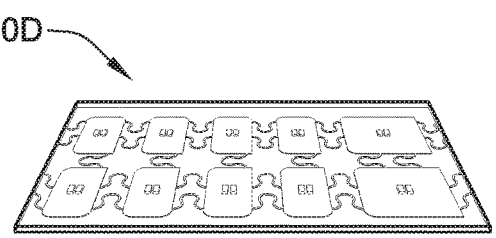

Turning next to FIG. 11A-11F, yet another conformal electronic device—referred to hereinafter as "Ex 5 Device"—is encapsulated using a lamination process. The Ex 5 Device is similar or substantially identical to the Ex 2 Device described herein, and thus can include any of the corresponding options and features discussed with reference thereto. In the illustrated embodiment, the liquid silicone used for the lamination procedure is Bluestar SILBIONE® RTV4545, which has low viscosity. The Ex 5 Device is encapsulated using substantially the same lamination procedure as the Ex 3 Device discussed hereinabove. The silicone sheets used for encapsulating are transparent, colored or translucent. FIGS. 11 and 11B show a top view and a bottom view, respectively, of a first representative embodiment 1100A of the Ex 5 device that is encapsulated with transparent translucent (or substantially transparent) silicone sheets. FIGS. 11E and 11F show a top view and a bottom view, respectively, of a third representative embodiment 1100C of the Ex 5 device that is encapsulated with colored silicone sheets. The Ex 5 device arrangements presented in FIGS. 11C to 11H have archipelago structures (e.g., a chain of IC device islands) that are encapsulated using transparent, translucent, or colored silicone sheets. The thicknesses of the encapsulated Ex 5 Devices 1100A, 1100B, 1100C and 1100D of FIGS. 11A-11H is less than about 0.20 mm, e.g., when encapsulated with 0.076 mm thick silicone sheets, and less than about 0.70 mm, e.g., when encapsulated with 0.25 mm thick silicone sheets.

The moisture sensing devices, namely Ex 1 and Ex 3 Devices, which include functional RFID chips and are formed using overmolding and lamination methods, respectively, are subjected to a water-proof measurement. Three (3) Ex 1 Devices and six (6) Ex 3 Devices (three each of 0.15 mm laminated devices and 0.25 mm laminated devices) are immersed in tap water and 0.7×PBS solution and cycled between a temperature of about 37 degrees Celsius and about 50 degrees Celsius sequentially for 28 days with a periodic change of measurement condition about every 7 days. The immersion depth is in the range of about 15-20 cm and devices are immersed continuously for about 28 days with a replacement of the bath solution every 7 days. The devices can measured periodically with an RFID reader, e.g., once every hour, to monitor the viability of the devices. The devices remain functional at the end of the measurement period. Visual inspection of each device does not reveal any noticeable signs of damage or penetration of the liquid into the encapsulated devices. Following the water-proof measurement, all the devices are re-tested per an Ingress Protection (IP) Rating procedure. The IP rating procedure provides a standardized method of evaluating the environmental capability of a device or product. Briefly, all the devices are immersed in water to a depth of about 1 meter for about 30 minutes (in an IP7 procedure that requires full immersion to 1 meter for 30 minutes). Visual inspection does not reveal any noticeable changes for overmolded and 0.25 mm silicone sheet laminated devices. Some delamination can develop on the 0.15 mm silicone sheet laminated devices. The devices pass the IP7 rating test.

EXAMPLE 6

Figure 12A:
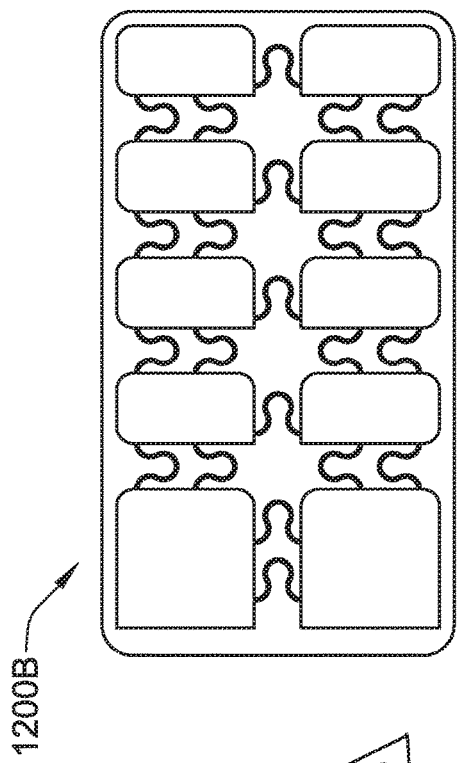
FIGS. 12A-12D illustrate encapsulated conformal electronics devices with an optional fabric feature in accord with aspects of the present disclosure.
Figure 12B:
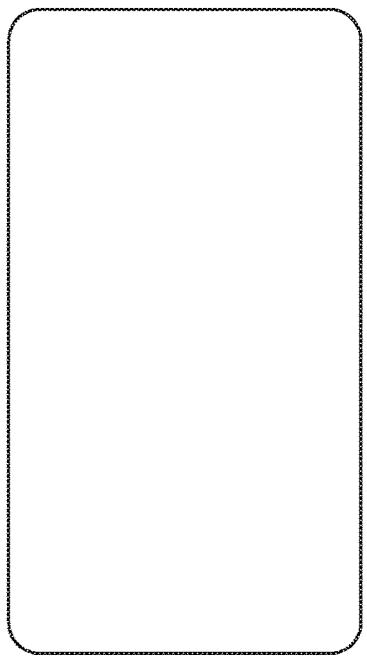
Figure 12C:
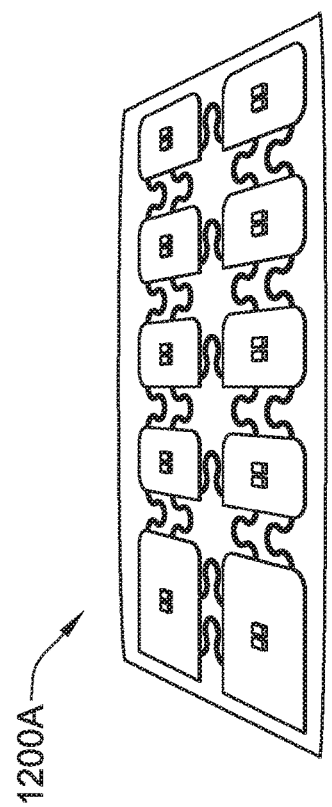
Figure 12D:
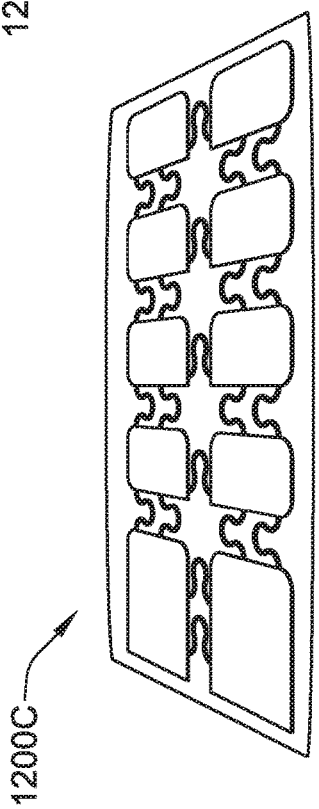

FIGS. 12A-12D show examples of the use of fabrics for strain limiting, strength reinforcement, and aesthetics effect in encapsulated conformal electronics devices. In these examples, the electronic structures include device islands and electronic components that are interconnected using stretchable electrical interconnects. The electronic structures are disposed on a material that can have different colors for differing aesthetic effect. For example, the material that forms a portion of the base of the conformal electronics device 1200A of FIG. 12A is yellow in color, giving a yellow appearance to the example system. In FIG. 12B, the material that forms a portion of the base of the conformal electronics device 1200B is green in color, giving a green appearance to the example system. By way of comparison, for FIG. 12C, the material that forms a portion of the base of the conformal electronics device 1200C is light grey in color, giving a light grey appearance to the example system. As per FIG. 12D, there is shown the opposite side of the example system of FIG. 12B, showing the green-colored material that is included to form the base of the example system. These additional fabric portions incorporated into the base can provide additional strength and reinforcement and aid in limiting the strain that the electronic structure is subjected to with any form of deformation.

Any of the disclosed encapsulated conformal electronics device architectures can be provided with one or more FPCBA strain limiters that: (1) limit strain in a single direction (e.g., a uniaxial or unidirectional strain limiter), (2) limit strain in multiple directions (e.g., a multi-axial or multidirectional strain limiter), (3) limit only stretching, (4) limit only bending, (5) limit only torsion, or (6) limits only stretching and bending, only stretching and torsion, or only bending and torsion. For some configurations, the strain limiter is configured to readily stretch within the product's predetermine "design window" (e.g., within 0-85% of stretchability range to failure). Conversely, the strain limiter may then be configured to immediately increase strain limiting at or near the product's predetermined "design limit" (e.g., within last 15% of stretchability range to failure). It is desirable, for at least some configurations, to maintain stretch limiting up to the ultimate force rating for the limiter/product. For stretch limiting, an encapsulated conformal electronics patch can begin to experience plastic deformation at approximately 20% global elongation on a one time basis; strain limiter in this example is designed to fully limit stretch at 15% global elongation. For bend limiting, in contrast, the limiter prevents or eliminates fully creasing the patch over on itself. For at least some ideal strain limiters: tensile strength is greater than approximately 5 lbf; maximum elongation before full tension is less than approximately 15%; minimize force to stretch to 15% elongation when encapsulated.

Figure 13A:
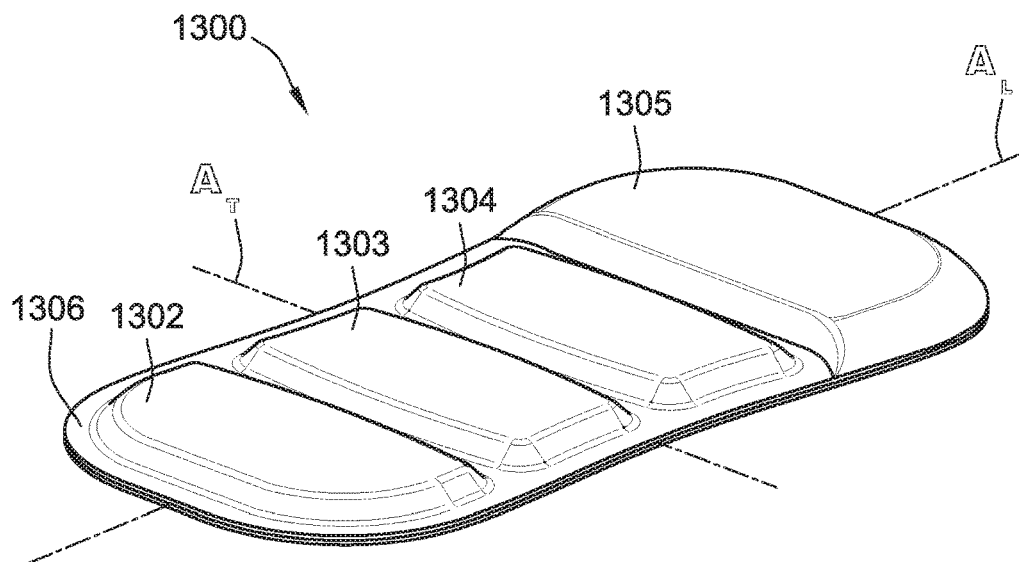
FIGS. 13A-13C are perspective-view, plan-view and side-view illustrations, respectively, of an example of a conformal electronics device with a "waffle" encapsulation architecture in accord with aspects of the present disclosure.
Figure 13B:
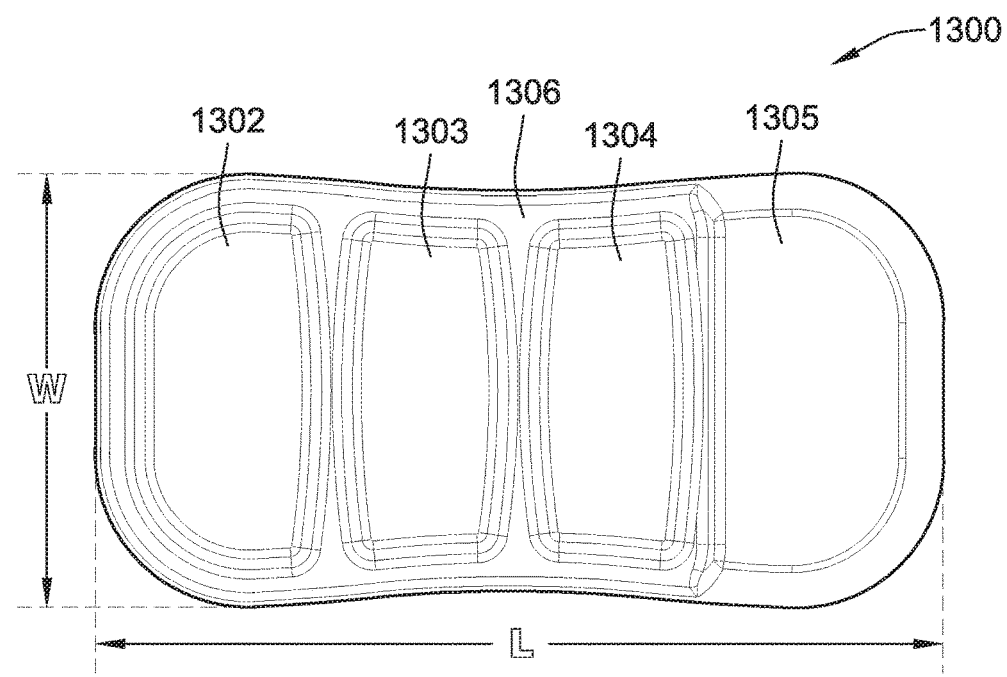
Figure 13C:
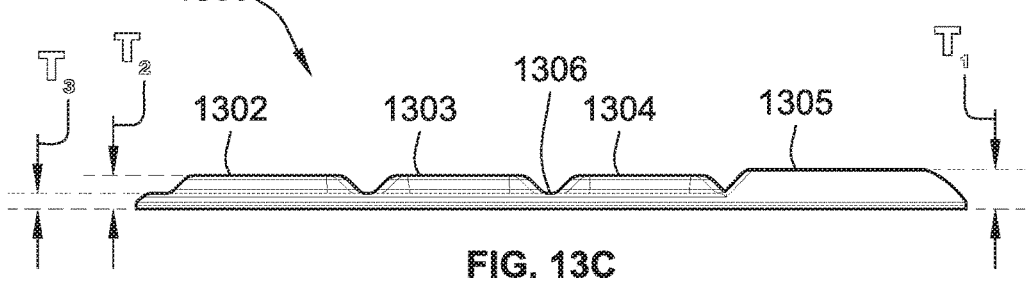

With reference now to FIGS. 13A-13C, there is shown a "waffle" type flexible printed circuit board assembly (FPCBA) housing 1300 for encapsulating therein conformal electronics. The resultant encapsulated conformal electronics device with the FPCBA housing 1300 can be fabricated from a hybrid molding and lamination process, such as that described below with reference to FIG. 14, using a liquid silicone material. The illustrated waffle design FPCBA housing 1300 results in a ~23% reduction in force to stretch over comparable non-waffle designs (e.g., planar designs). It has been determined that the force to stretch ratio can be modulated by configuring a flexible material with a selected durometer rating. For example, a 50% reduction in silicone durometer results in a ~50% reduction in force to stretch in the FPCBA housing 1300. Among other advantages, the waffle design shown in FIGS. 13-13C helps to support stretchable interconnects with smaller cross-sections by limiting the type and amount of deformation that the assembly can experience.

Another advantage of the exemplar waffle housing 1300 is material cost savings realized by minimizing or eliminating material from sections of the housing that do not seat therein one of the IC device islands. By way of example, FPCBA housing 1300 comprises a plurality of compartments, namely first, second, third and fourth partially hollow, vaulted compartments 1302-1305, that are spaced longitudinally along the length of the housing. Each said compartment 1302-1305 nests therein one or more IC device islands or other electronic module. A recessed perimeter 1306 surrounds the first three compartments 1302-1304 such that recessed gaps 1307-1309 (FIG. 13C) separate the four compartment 1302-1305. When compared with a planar encapsulation design (e.g., comparing FIG. 13C with FIG. 11D), it can be seen that much of the excess material above and between the compartments 1302-1305 has been eliminated. Rounded corners and chamfered edges help to further reduce material expenditure in the illustrated embodiment.

Another notable advantage is that the waffle geometry allows designers to localize deformation at preferred locations and thereby restrict the deformation that can be experienced by the waffle design FPCBA housing 1300. By providing elongated compartments that are oriented transversely, extending approximately the entire width of the housing, while being spaced longitudinally, the design in FIGS. 13A-13C, for example, generally restricts deformation to longitudinal stretching (i.e., elongation of the housing 1300 along the major central axis $A_L$), longitudinal torsion (i.e., twisting about the major central axis), and transverse bending (i.e., flexure around a central transverse axis $A_T$). That is not to say that all other types of deformation are eliminated; rather, other types of deformation are reduced when compared to those enumerated previously. In alternate configurations, the vaulted compartments can be reconfigured (e.g., reshaped, reoriented and/or repositioned) such that deformation is limited to stretching along a lateral (minor) axis and bending along a longitudinal (major) axis. This design also helps to reduces perceptibility of the conformal device on a user by reducing elastic force that restore the assembly to a planar nature.

As shown, the waffle design FPCBA housing 1300 has a length L of approximately 66 mm, a major width W of approximately 34 mm at its widest point, and a minor width of approximately 31 mm at its narrowest point (e.g., center in FIG. 3B). Waffle design FPCBA housing 1300 has a first (largest) thickness $T_1$ of approximately 3.14 mm defined by the fourth compartment 1305, a second (medium) thickness $T_2$ of approximately 2.64 mm defined by the first, second and third compartments 1302-1304, and a third (smallest) thickness $T_3$ of approximately 1.22 mm defined by the recessed perimeter 1306. It is desirable, for at least some embodiments, that the housing 1300 be fabricated from a material that is soft enough to conform to the body of a human, that is comfortable for continuous wear over an extended period of time, that is biocompatible and hypoallergenic, and/or is rugged enough to not tear or allow damage to the internal electronics.

Figure 14:
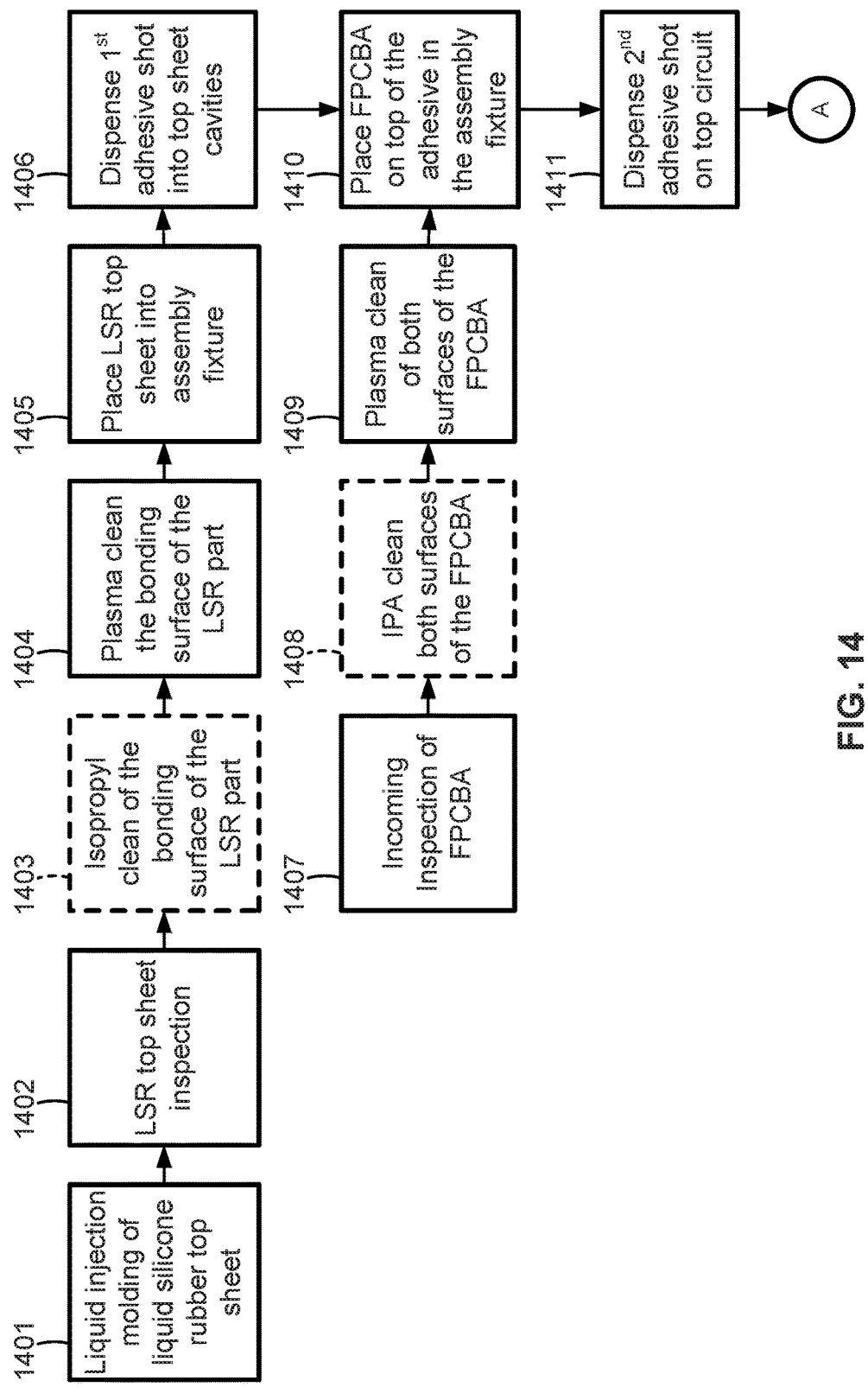
FIG. 14 is a diagrammatic illustration of yet another representative method for encapsulating a conformal electronic device in accord with aspects of the present disclosure The present disclosure is susceptible to various modifications and alternative forms, and some representative embodiments have been shown by way of example in the drawings and will be described in detail herein. It should be understood, however, that the inventive aspects are not limited to the particular forms illustrated in the drawings. Rather, the disclosure is to cover all modifications, equivalents, and alternatives falling within the spirit and scope of the invention as defined by the appended claims.
Figure 14:
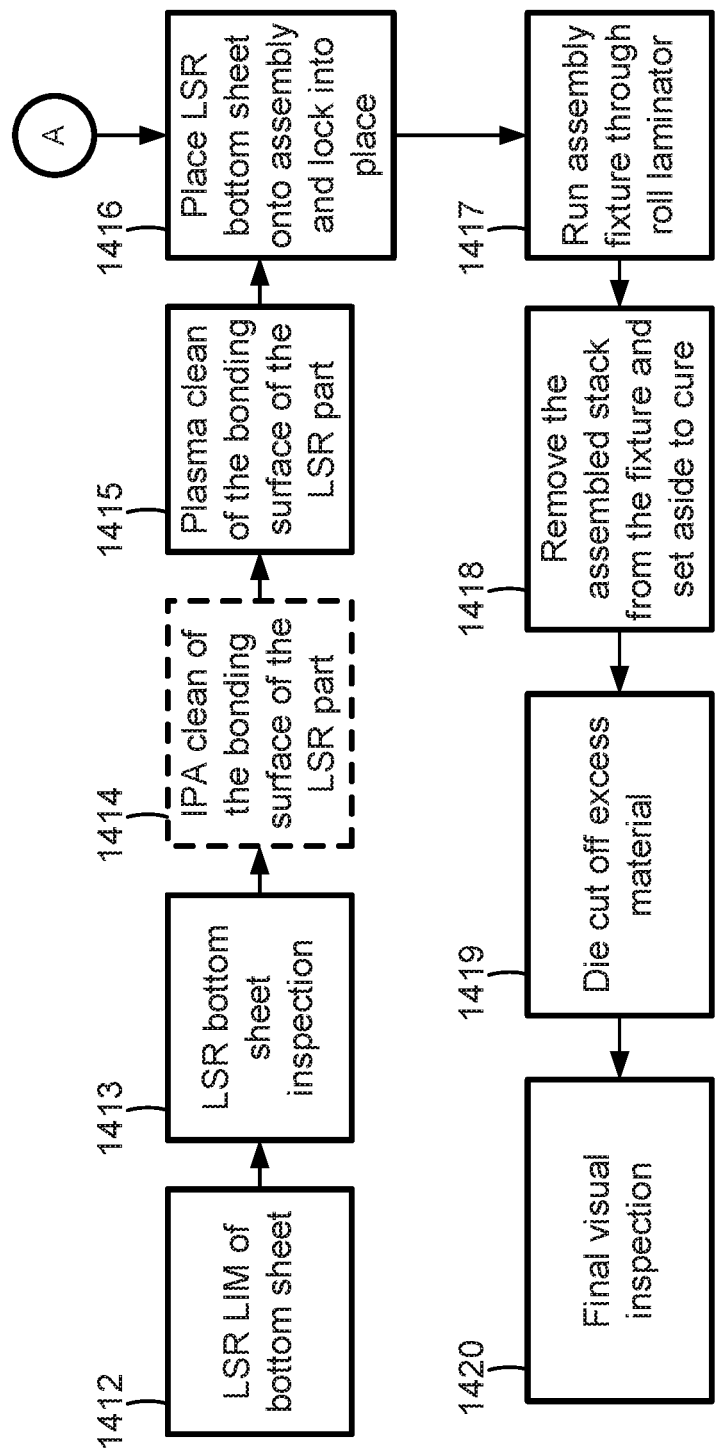

FIG. 14 is a flow chart diagrammatically illustrating a representative method 1400 for encapsulating a conformal electronic device with a hybrid injection molding-lamination process. As indicted above, for at least some embodiments, the method 1400 includes at least those steps enumerated in FIG. 14. Nevertheless, the method 1400 may omit some of the illustrated steps, include additional steps, and/or modify the order presented. At Block 1401, the method 1400 starts with liquid injection molding (LIM) of a liquid silicone resin (LSR) top sheet, e.g., from Bluestar SILBIONE® LSR4325. Block 1402 comprises inspecting the LSR top sheet (#1 LSR). The LSR top sheet may be inspected manually or via automated sampling or by other known or hereinafter developed methods of robotic high-speed vision inspection of IC componentry. Such inspection of parts may be conducted in accordance with quality acceptance specifications developed for engineering review by the manufacturer.

Block 1403, which is shown with dashed lines in FIG. 14 as it is not desirable for some embodiments, comprises an isopropyl alcohol (IPA) clean of the bonding surfaces of the LSR top sheet. For at least those methodologies wherein Block 1403 is included, the LSR top sheet is placed, e.g., on a clean TEXWIPE®, with the bonding side up, then IPA is sprayed liberally across the surfaces with the excess being removed, for example, using a cleanroom all-purpose 4×4 cotton TEXWIPE®. Cleaned LSR parts are then placed onto a tray to dry, e.g., for at least 5 minutes. Then, at Block 1404, the bonding surfaces of the LSR bottom sheet are O2 plasma cleaned. Plasma cleaning may comprise positioning an O2 Plasma Pen at least 10 mm but no more than 20 mm away from each part, applying plasma to the surface in a sweeping motion while trying to ensure all of the surfaces see plasma. Batch plasma cleaning of the bonding surfaces of the LSR parts can be automated or manual.

After cleaning, the LSR top sheet is placed into an assembly fixture at Block 1405. By way of non-limiting example, the LSR top sheet (LSR #1) is placed into the bottom assembly fixture while ensuring that the LSR component is centered properly and flush with the aluminum assembly fixture. This may comprise robotic or operator placement of the LSR top sheet into a multi-cavity assembly fixture. Then, at Block 1406, the first shot of adhesive is dispensed into the top sheet cavities. This may comprise automated or manual dispensing of an adhesive (shot #1) using a pneumatic adhesive dispenser to apply adhesive (e.g., DOW CORNING® 3140 room temperature vulcanization (RTV) silicone adhesive coating) to the LSR part (e.g., into the top sheet cavities).

A lot paper traveler is started to receive incoming flexible printed circuit board assemblies (FPCBA), with the incoming FPCBA boards being shipped to LSR and received in trays with lids and foam inserts. Incoming FPCBA's can be inspected manually or via an automated sampling device at Block 1407, e.g., to ensure that all parts have been shipped and received without being bent or grossly damaged. This may include confirming that all of the FPCBA islands are symmetrically separated without being improperly stretched, compressed or bent. Block 1408, which is shown with dashed lines in FIG. 14 as it is not desirable for some embodiments, comprises an isopropyl alcohol (IPA) clean of top and bottom surfaces of the FPCBA. For at least some methodologies wherein Block 1408 is included, the FPCBA is placed on a clean TEXWIPE® with the die side up. IPA is sprayed across the surface with the excess being removed, for example, using a foam brush. The FPCBA is then flipped over and IPA is sprayed onto the back side with any excess IPA being removed, e.g., using a 4×4 TEXWIPE®. Cleaned FPCBA is placed onto a tray to dry, e.g., for at least 5 minutes. Next, at Block 1409, both sides of the FPCBA are O2 plasma cleaned. Plasma clean both sides of the FPCBA, e.g., with an O2 Plasma Pen positioned at least 10 mm but no more than 20 mm away, applying plasma to the surface in a sweeping motion while trying to ensure all surfaces are exposed to plasma. The FPCBA is subsequently flipped over and the plasma clean is repeated for the obverse side. Batch plasma cleaning of the FPCBA surfaces can be automated or manual.

At block 1410, the cleaned FPCBA is placed into the assembly fixture. In an example, the FPCBA is placed board face down into the top assembly fixture while ensuring it is properly centered. Automated or operator placement of the FPCBA on top of the adhesive in the multi-cavity assembly fixture is an available option. Gentle pressure is applied, e.g., using a cotton swab, until adhesive starts to squeeze out at the edges from between the FPCBA and LSR top sheet. Afterwards, at Block 1411, the second shot of adhesive is dispensed into the assembly fixture. This may comprise automated or manual dispensing of an adhesive (shot #2) using the pneumatic adhesive dispenser to apply the adhesive (DOW CORNING® 3140) to the backside of the FPCBA.

At Block 1412, the method 1400 of FIG. 14 continues with liquid injection molding (LIM) of a liquid silicone resin (LSR) bottom sheet, e.g., from Bluestar SILBIONE® LSR4325. This may be performed in much the same manner as LIM of the LSR top sheet (Block 1401). Block 1413 comprises inspecting the LSR bottom sheet (#2 LSR). This step may be performed in the same or a similar manner to that explicated above with respect to Block 1402. In the same vein, an isopropyl alcohol (IPA) clean of the bonding surfaces of the LSR bottom sheet may optionally be performed, as indicated at Block 1414. Then, at Block 1415, the bonding surfaces of the LSR bottom sheet are O2 plasma cleaned. Reference may be made to Blocks 1403 and 1404 for performing the steps presented at Blocks 1414 and 1415, respectively. Once properly cleaned, the LSR bottom sheet is placed into an assembly fixture and locked into place at Block 1416. This may comprise robotic or operator placement of the LSR bottom sheet into the assembly fixture. Using external LSR mating features, such as complementary posts and slots in the now-opposing LSR parts, the #2 LSR part is placed onto the FPCBA assembly. The posts are pushed into place while ensuring that all posts and holes have mated properly.

At block 1417, the multi-cavity assembly fixture is fed, pulled, or otherwise transported through a roll laminator. An optional protective laminant sheet can be placed over the assembly fixture for this portion of the method 1400. Block 1417 may comprise adjusting roller height on opposing lateral sides to ensure that the roller is set at a desired/predetermined height. Roller speed can be set to a slow speed or the slowest available speed prior to initiating the lamination process. The assembly fixture can be passed through the roll laminator for a single pass or for multiple passes. For a representative multi-pass scenario, which may be fully or partially automated, the first run is initiated, e.g., with the fixture fed through the rollers in a first orientation. For the second run, the fixture is repositioned and then fed through the rollers again. Prior to the second run, the roller height may be readjusted. Much like the second pass, a third run may be performed by first repositioning and tightening the roller height, repositioning the fixture, and then feeding the fixture through the rollers. One or more additional passes may be performed as necessary or desired.

Method 1400 of FIG. 14 continues to Block 1418 where the assembled stack is removed from the fixture and set aside to cure. This may comprise peeling off or otherwise removing the laminant sheet from the assembled stack, and placing the assembled stack on curing trays. In the event that excess adhesive is present (e.g., has squeezed out onto the backside of the stack), any overflow adhesive can be cut away and removed from the assembled stack. The assembled part is then gently placed onto a designated drying tray and left on a shelf, e.g., for at least approximately 24 hours. Block 1419 then requires die cutting, with a final inspection at Block 1420.

One or more of the molds can be provided with overflow channels such that, during lamination, excess adhesive can "squish out" or otherwise flow beyond the cavity of the functional part and into a scrap area on the periphery that can be cut/removed after assembly and cure. These overflow channels help to reduce the need to be extremely precise with the amount of adhesive added to the mold before insertion into a press. It has been determined that lower modulus glues can act as a buffer between the liquid silicone rubber (LSR) and the electronic components. It has also been determined that layered modulus structures affect reliability, deformability and feel of the device. Features in the molded silicone can be provided to capture the board and make sure it is in a relaxed/stress neutral state during and after assembly.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be examples and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that inventive embodiments may be practiced otherwise than as specifically described. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention may be implemented in any of numerous ways. For example, some embodiments may be implemented using hardware, software or a combination thereof. When any aspect of an embodiment is implemented at least in part in software, the software code may be executed on any suitable processor or collection of processors, whether provided in a single device or computer or distributed among multiple devices/computers. Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of the invention as defined in the appended claims.

What is claimed is:

1. A conformal integrated circuit (IC) device comprising:
   a flexible substrate;
   electronic circuitry attached to the flexible substrate; and
   a flexible polymeric encapsulation layer attached to the flexible substrate, the flexible polymeric encapsulation layer forming a vaulted compartment encasing therein at least a portion of the electronic circuitry between the flexible substrate and the vaulted compartment of the flexible polymeric encapsulation layer,
   wherein the vaulted compartment is separated from a second vaulted compartment by a recessed portion, and the flexible polymeric encapsulation layer and the flexible substrate have a collective thickness in the range of about 1.0 mm to about 2.0 mm.

2. The conformal IC device of claim 1, wherein the flexible polymeric encapsulation layer comprises a stretchable and bendable non-conductive material.

3. The conformal IC device of claim 1, wherein the flexible polymeric encapsulation layer is fabricated from a polyimide (PI), a polyethylene terephthalate (PET), a silicone, or a polyurethane, or any combination thereof.

4. The conformal IC device of claim 1, wherein the flexible polymeric encapsulation layer is configured to hermetically seal the electronic circuitry.

5. The conformal IC device of claim 1, wherein the flexible polymeric encapsulation layer is fabricated from an ultraviolet (UV) curable silicone.

6. The conformal IC device of claim 1, wherein the flexible substrate comprises a stretchable and bendable non-conductive polymeric material.

7. The conformal IC device of claim 1, wherein the flexible substrate is fabricated from a polyimide (PI), a polyethylene terephthalate (PET), a silicone, or a polyurethane, or any combination thereof.

8. The conformal IC device of claim 1, wherein the electronic circuitry comprises an integrated circuit sensor system with at least one sensing device and at least one controller device.

9. The conformal IC device of claim 1, wherein the electronic circuitry comprises a plurality of spaced device islands electrically and physically connected via a plurality of stretchable electrical interconnects.

10. The conformal IC device of claim 1, wherein the flexible polymeric encapsulation layer is configured to facilitate modulation of a stress or a strain, or both, on a predetermined portion of the conformal IC device by adjusting a location of a neutral mechanical plane relative to a functional component of the electronic circuitry.

11. The conformal IC device of claim 1, wherein the flexible polymeric encapsulation layer and the substrate both have an elongation in the range of about 200% to about 800%.

12. The conformal IC device of claim 1, further comprising a series of flexible polymeric encapsulation layers disposed on top of the flexible polymeric encapsulation layer.

13. The conformal IC device of claim 1, further comprising a base plate disposed on the flexible substrate, and an electrical contact disposed on the base plate, wherein the electronic circuitry is attached to the electrical contact.

14. The conformal IC device of claim 1, wherein the flexible polymeric encapsulation layer is adhered to the flexible substrate via a liquid silicone adhesive coating.

15. The conformal IC device of claim 1, wherein the conformal IC device has an overall thickness in the range of about 1 mm to about 6 mm.

16. The conformal IC device of claim 1, wherein the flexible polymeric encapsulation layer attached to the flexible substrate forms a housing defining a major central first axis and a central transverse second axis, and wherein housing deformations are generally restricted to stretching along one of the first and second axes and to bending along the other of the first and second axes.

17. A conformal electronics device comprising:
an elongated flexible polymeric substrate;
a plurality of surface-mount technology (SMT) components configured as device islands attached to the elongated flexible polymeric substrate;
a plurality of stretchable interconnects electrically connecting the SMT components; and
a flexible polymeric encapsulation layer attached to the elongated flexible polymeric substrate, the flexible polymeric encapsulation layer forming a vaulted compartment encasing therein at least a portion of the SMT components and the stretchable interconnects between the elongated flexible polymeric substrate and the vaulted compartment of the flexible polymeric encapsulation layer,
wherein the vaulted compartment is separated from a second vaulted compartment by a recessed portion, and the flexible polymeric encapsulation layer and the elongated flexible polymeric substrate have a collective thickness in the range of about 1.0 mm to about 2.0 mm.

18. The conformal electronics device of claim 17, wherein the flexible polymeric encapsulation layer comprises a stretchable and bendable non-conductive material.

19. The conformal electronics device of claim 17, wherein the flexible polymeric encapsulation layer is fabricated from a polyimide (PI), a polyethylene terephthalate (PET), a silicone, or a polyurethane, or any combination thereof.

20. The conformal electronics device of claim 17, wherein the flexible polymeric encapsulation layer is configured to hermetically seal the conformal electronics device.

21. The conformal electronics device of claim 17, wherein the elongated flexible polymeric substrate comprises a stretchable and bendable non-conductive material.

22. The conformal electronics device of claim 17, wherein the elongated flexible polymeric substrate is fabricated from a polyimide (PI), a polyethylene terephthalate (PET), a silicone, or a polyurethane, or any combination thereof.

23. The conformal electronics device of claim 17, wherein the SMT components include at least one sensing device and at least one controller device.

24. The conformal electronics device of claim 17, wherein the flexible polymeric encapsulation layer is configured to facilitate modulation of a stress or a strain, or both, on a predetermined portion of the conformal electronics device by adjusting a location of a neutral mechanical plane relative to the SMT components and the stretchable interconnects.

25. The conformal electronics device of claim 17, wherein the flexible polymeric encapsulation layer and the elongated flexible polymeric substrate both have an elongation in the range of about 200% to about 800%.

26. The conformal electronics device of claim 17, further comprising a series of flexible polymeric encapsulation layers disposed on top of the flexible polymeric encapsulation layer.

27. The conformal electronics device of claim 17, further comprising a base plate disposed on the elongated flexible polymeric substrate, and an electrical contact disposed on the base plate, wherein one or more of the SMT components or the stretchable interconnects are attached to the electrical contact.

28. The conformal electronics device of claim 17, wherein the flexible polymeric encapsulation layer is adhered to the elongated flexible polymeric substrate via a liquid silicone adhesive coating.

29. The conformal electronics device of claim 17, wherein the conformal electronics device has an overall thickness in the range of about 1 mm to about 6 mm.

30. The conformal electronics device of claim 17, wherein the flexible polymeric encapsulation layer attached to the elongated flexible polymeric substrate forms a housing defining a major central first axis and a central transverse second axis, and wherein housing deformations are generally restricted to stretching along one of the first and second axes and to bending along the other of the first and second axes.

* * * * *